(12) United States Patent
Cha et al.

(10) Patent No.: US 11,158,258 B2
(45) Date of Patent: Oct. 26, 2021

(54) DISPLAY PANEL HAVING AN INPUT SENSING FUNCTION AND A DISPLAY DEVICE

(71) Applicant: Samsung Display Co., Ltd., Yongin-Si (KR)

(72) Inventors: Goeun Cha, Cheonan-si (KR); KyungTea Park, Seoul (KR); Keumdong Jung, Seoul (KR); Suk Kim, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/995,204

(22) Filed: Aug. 17, 2020

(65) Prior Publication Data
US 2021/0158751 A1  May 27, 2021

(30) Foreign Application Priority Data
Nov. 25, 2019  (KR) .......................... 10-2019-0152466

(51) Int. Cl.
*G09G 3/3233* (2016.01)
*G09G 3/20* (2006.01)
(Continued)

(52) U.S. Cl.
CPC ......... *G09G 3/3233* (2013.01); *G06K 9/0004* (2013.01); *G09G 3/2003* (2013.01); *G06F 3/0446* (2019.05); *G09G 2300/0452* (2013.01); *G09G 2300/0809* (2013.01); *G09G 2354/00* (2013.01)

(58) Field of Classification Search
CPC ............... G09G 3/3233; G09G 3/2003; G09G 2354/00; G09G 2300/0452; G09G 2300/0809; G06K 9/0004; G06F 3/0446
See application file for complete search history.

(56) References Cited

U.S. PATENT DOCUMENTS

| 10,540,533 B2 | 1/2020 | Yang |
| 2005/0007353 A1* | 1/2005 | Smith .................. G09G 3/3233 345/204 |

(Continued)

FOREIGN PATENT DOCUMENTS

| CN | 106409224 | 2/2017 |
| CN | 107220630 | 9/2017 |
| KR | 10-2018-0100472 | 9/2018 |

*Primary Examiner* — Premal R Patel
(74) *Attorney, Agent, or Firm* — F. Chau & Associates, LLC

(57) ABSTRACT

A display panel including: a plurality of light emitting pixels which emit light in response to a first scan signal, a second scan signal, and a light emission control signal; and a plurality of light sensing pixels which output a sensing signal corresponding to external light in response to the first scan signal and the second scan signal, wherein each of the plurality of light emitting pixels includes an organic light emitting diode including an anode and a cathode, the cathode receiving a first driving voltage, and each of the plurality of light sensing pixels includes an organic photodiode including a first electrode and a second electrode, wherein the second electrode of the organic photodiode is electrically connected to the cathode of the organic light emitting diode to receive the first driving voltage.

20 Claims, 12 Drawing Sheets

(51) Int. Cl.
    *G06K 9/00*     (2006.01)
    *G06F 3/044*     (2006.01)

(56)     References Cited

U.S. PATENT DOCUMENTS

| | | | |
|---|---|---|---|
| 2008/0231563 A1* | 9/2008 | Kim | G09G 5/14 345/80 |
| 2010/0177075 A1* | 7/2010 | Fish | G09G 3/3233 345/207 |
| 2011/0096027 A1* | 4/2011 | Jeon | G06F 3/0412 345/175 |
| 2011/0164011 A1* | 7/2011 | Yamamoto | G09G 3/3233 345/207 |
| 2014/0061739 A1* | 3/2014 | Kurokawa | G06F 3/042 257/292 |
| 2015/0035798 A1* | 2/2015 | Zhou | G09G 3/3266 345/174 |
| 2015/0125973 A1* | 5/2015 | Choi | H01L 27/3276 438/23 |
| 2016/0321987 A1* | 11/2016 | Oh | G06F 3/03542 |
| 2018/0210571 A1 | 7/2018 | Wang et al. | |
| 2019/0013368 A1 | 1/2019 | Chung et al. | |
| 2019/0355302 A1* | 11/2019 | Ding | H01L 27/14609 |
| 2020/0043417 A1 | 2/2020 | Yang et al. | |
| 2020/0192522 A1* | 6/2020 | Reynolds | G06F 3/0421 |

\* cited by examiner

DISPLAY PANEL HAVING AN INPUT SENSING FUNCTION AND A DISPLAY DEVICE

CROSS-REFERENCE TO RELATED APPLICATION

This U.S. non-provisional patent application claims priority under 35 U.S.C. § 119 to Korean Patent Application No. 10-2019-0152466, filed on Nov. 25, 2019, the disclosure of which is incorporated by reference herein in its entirety.

Technical Field

Exemplary embodiments of the present invention relate to a display device, and more particularly, to a display panel capable of sensing an external input and a display device including the same.

Discussion of Related Art

A display device is an output device for presentation of information in visual form. Example devices having a display device for displaying an image are a multimedia display device such as a television, a mobile phone, a tablet computer, a navigation device, and a game machine. A display device may include a touch screen for input in addition to general inputs such as a button, a keyboard, or a mouse. A touch screen is an input sensing panel capable of providing a touch-based input method that allows a user to easily input information or commands in an intuitive and convenient manner.

Recently, a fingerprint, which is one example of biometric information, has been proposed as a user authentication means for online banking, product purchase, security, and the like. Accordingly, there is an increasing demand for a touch screen display device having a fingerprint identification function.

SUMMARY

An exemplary embodiment of the present invention provides a display panel including: a plurality of light emitting pixels which emit light in response to a first scan signal, a second scan signal, and a light emission control signal; and a plurality of light sensing pixels which output a sensing signal corresponding to external light in response to the first scan signal and the second scan signal, wherein each of the plurality of light emitting pixels includes an organic light emitting diode including an anode and a cathode, the cathode receiving a first driving voltage, and each of the plurality of light sensing pixels includes an organic photodiode including a first electrode and a second electrode, wherein the second electrode of the organic photodiode is electrically connected to the cathode of the organic light emitting diode to receive the first driving voltage.

In an exemplary embodiment of the present invention, each of the plurality of light sensing pixels may further include: a first transistor including a first electrode configured to receive the second scan signal, a second electrode connected to a charge storage node, and a gate electrode configured to receive the first scan signal; a second transistor including a first electrode, which receives a second driving voltage, a second electrode, and a gate electrode connected to the charge storage node; and a third transistor including a first electrode connected to the second electrode of the second transistor, a second electrode connected to a fingerprint sensing line, and a gate electrode configured to receive the second scan signal.

In an exemplary embodiment of the present invention, the first electrode of the organic photodiode may be electrically connected to the charge storage node.

In an exemplary embodiment of the present invention, the second scan signal may have a voltage level higher than the first driving voltage when the first scan signal turns on the first transistor.

In an exemplary embodiment of the present invention, each of the plurality of light emitting pixels may emit light when the light emission control signal is at an active level, and each of the plurality of light sensing pixels may store a charge corresponding to the external light in the charge storage node, output a fingerprint sensing signal corresponding to the charge stored in the charge storage node to the fingerprint sensing line when the second scan signal is at the active level, and reset the charge storage node when the first scan signal is at the active level.

In an exemplary embodiment of the present invention, each of the plurality of light emitting pixels may further include: a first transistor including a first electrode, which receives a data signal, a second electrode, and a gate electrode configured to receive the first scan signal; a second transistor which includes a gate electrode configured to receive the light emission control signal; and a third transistor connected to the first transistor and the second transistor and configured to provide a driving current to the organic light emitting diode.

In an exemplary embodiment of the present invention, each of the plurality of light emitting pixels may further include a fourth transistor which includes a gate electrode configured to receive the second scan signal and transmits an initialization voltage to a gate electrode of the third transistor.

In an exemplary embodiment of the present invention, each of the plurality of light emitting pixels may further include a fifth transistor which is connected between the first transistor and the anode of the organic light emitting diode and includes a gate electrode configured to receive the light emission control signal.

In an exemplary embodiment of the present invention, the plurality of light emitting pixels may include a first color light emitting pixel, a second color light emitting pixel, and a third color light emitting pixel.

In an exemplary embodiment of the present invention, the first color light emitting pixel, at least one of the plurality of light sensing pixels, the second color light emitting pixel, and at least one of the plurality of light sensing pixels may be sequentially arranged in a second direction crossing a first direction in a first row, and at least one of the plurality of light sensing pixels and the third color light emitting pixel may be sequentially arranged in the second direction in a second row adjacent to the first row.

An exemplary embodiment of the present invention provides a display device including: a display panel including a plurality of light emitting pixels and a plurality of light sensing pixels; and a fingerprint readout circuit which controls the display panel and receives a fingerprint sensing signal through a fingerprint sensing line from the light sensing pixels, wherein each of the plurality of light emitting pixels includes an organic light emitting diode including an anode and a cathode, the cathode connected to a first driving voltage line, and each of the plurality of light sensing pixels includes an organic photodiode which includes a first electrode and a second electrode, wherein the second electrode of the organic photodiode is connected to the first driving voltage line.

In an exemplary embodiment of the present invention, each of the plurality of light sensing pixels may further include: a reset transistor including a gate electrode configured to receive a first scan signal, a first electrode configured to receive a second scan signal, and a second electrode connected to a charge storage node; an amplifying transistor including a gate electrode connected to the charge storage node, a first electrode configured to receive a second driving voltage, and a second electrode; and an output transistor including a gate electrode configured to receive the second scan signal, a first electrode connected to the second electrode of the amplifying transistor, and a second electrode connected to the fingerprint sensing line.

In an exemplary embodiment of the present invention, the first electrode of the organic photodiode may be electrically connected to the charge storage node.

In an exemplary embodiment of the present invention, the second scan signal may have a voltage level higher than the first driving voltage when the first scan signal is at an active level.

In an exemplary embodiment of the present invention, each of the plurality of light emitting pixels may emit light in response to the first scan signal, the second scan signal, and a light emission control signal, and each of the plurality of the light sensing pixels may store a charge corresponding to external light in the charge storage node, output a fingerprint sensing signal corresponding to the charge stored in the charge storage node to the fingerprint sensing line when the second scan signal is at an active level, and reset the charge storage node when the first scan signal is at the active level.

In an exemplary embodiment of the present invention, the display panel may further include a scan driver configured to output the first scan signal, the second scan signal, and the light emission control signal.

An exemplary embodiment of the present invention provides a display device including: a base layer; light emission electronic devices disposed on the base layer; light sensing electronic devices disposed on the base layer; an organic light emitting diode including an anode electrically connected to the light emission electronic devices, a cathode, and a light emitting layer disposed between the anode and the cathode; and an organic photodiode including a first electrode electrically connected to the light sensing electronic devices, a second electrode, and a photoelectric conversion layer disposed between the first electrode and the second electrode, wherein the second electrode of the organic photodiode and the cathode of the organic light emitting diode are included in the same layer.

In an exemplary embodiment of the present invention, the base layer may include a display area and a non-display area adjacent to the display area, and the organic light emitting diode and the organic photodiode are disposed above the base layer in the display area.

In an exemplary embodiment of the present invention, at least one of the light emission electronic devices is configured to control the organic light emitting diode to emit light in response to a first scan signal, a second scan signal, and a light emission control signal, and at least one of the light sensing electronic devices stores a charge generated by the organic photodiode in a charge storage node, outputs a fingerprint sensing signal, to a fingerprint sensing line, when the second scan signal is at an active level, and resets the charge storage node when the first scan signal is at an active level, wherein the fingerprint sensing signal corresponds to the charge stored in the charge storage node.

In an exemplary embodiment of the present invention, the at least one light sensing electronic device may include: a reset transistor including a gate electrode configured to receive the first scan signal, a first electrode configured to receive the second scan signal, and a second electrode connected to the charge storage node; an amplifying transistor including a gate electrode connected to the charge storage node, a first electrode configured to receive a second driving voltage, and a second electrode; and an output transistor including a gate electrode configured to receive the second scan signal, a first electrode connected to the second electrode of the amplifying transistor, and a second electrode connected to the fingerprint sensing line, wherein the first electrode of the organic photodiode is connected to the charge storage node.

BRIEF DESCRIPTION OF THE FIGURES

The above and other features of the present invention will become more apparent by describing in detail exemplary embodiments thereof with reference to the accompanying drawings wherein.

DETAILED DESCRIPTION OF THE EMBODIMENTS

Figure 1:
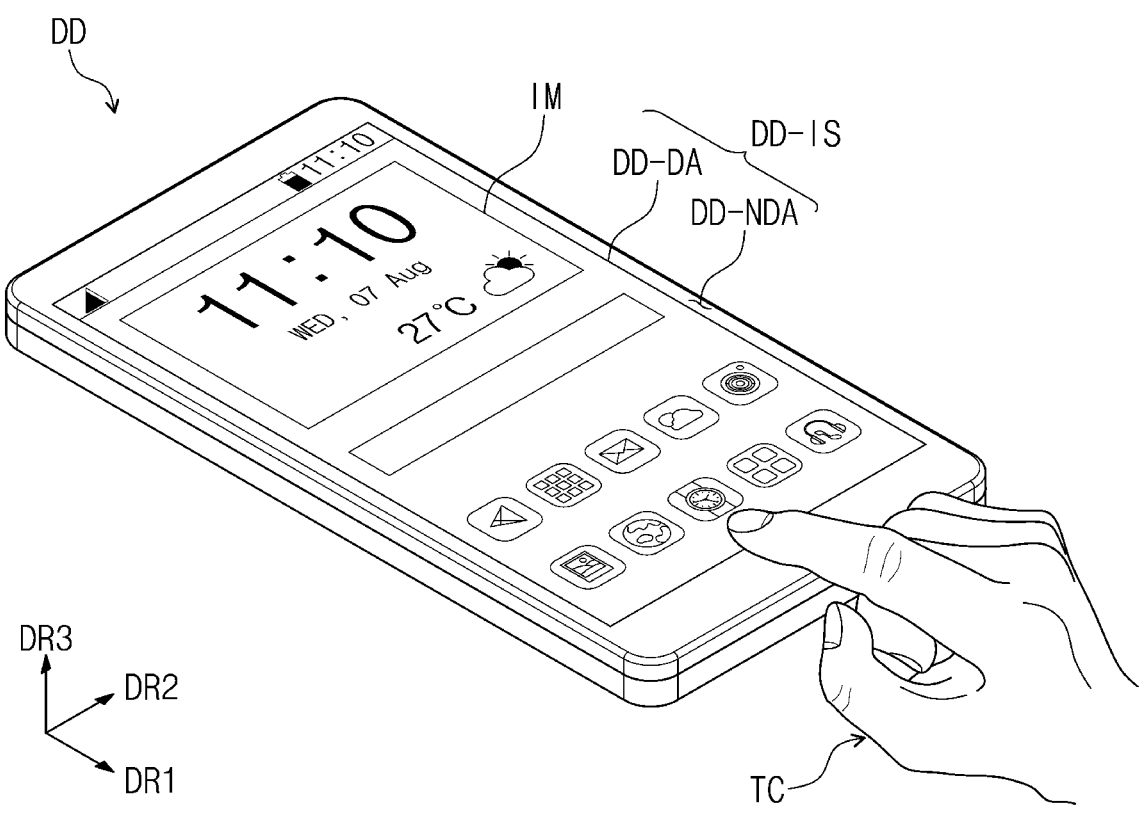
FIG. 1 is a perspective view of a display device according to an exemplary embodiment of the present invention.

Herein, it will be understood that when an element or layer is referred to as being "on", "connected to" or "coupled to" another element or layer, it can be directly on, connected or coupled to the other element or layer, or intervening elements or layers may be present.

Like reference numerals may refer to like elements throughout this specification. In the figures, the thicknesses of layers, films or regions may be exaggerated for clarity.

As used herein, the singular forms, "a", "an" and "the" are intended to include the plural forms as well, unless the context clearly indicates otherwise.

Hereinafter, exemplary embodiments of the present invention will be explained in detail with reference to the accompanying drawings.

Figure 2:
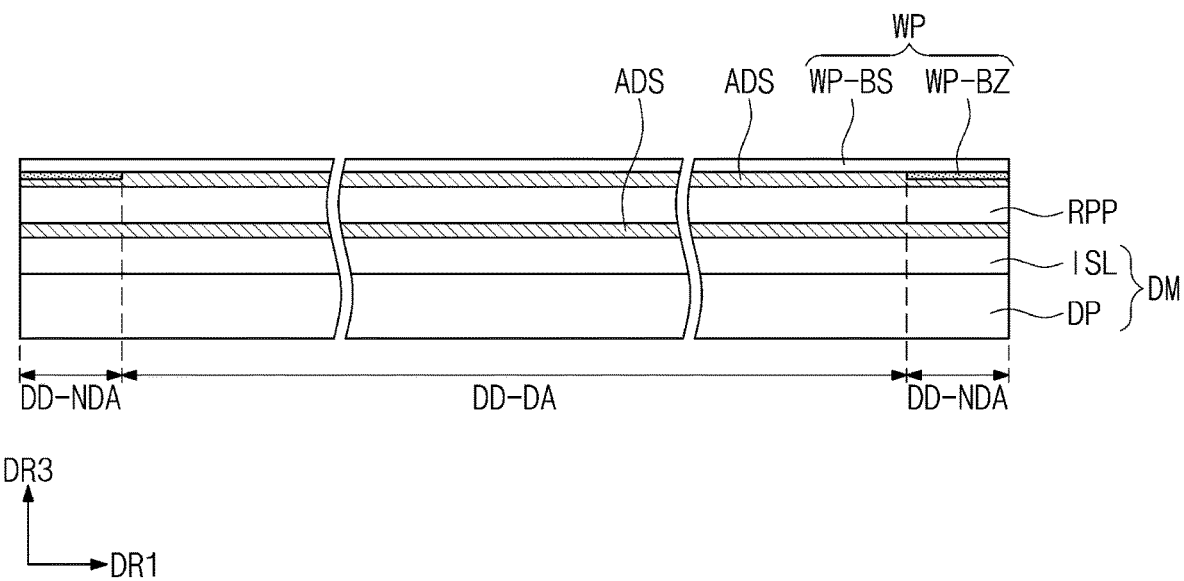
FIG. 2 is a cross-sectional view of a display device according to an exemplary embodiment of the present invention.

FIG. 1 is a perspective view of a display device DD according to an exemplary embodiment of the present invention. FIG. 2 is a cross-sectional view of the display device DD according to an exemplary embodiment of the present invention.

As illustrated in FIG. 1, the display device DD may display an image IM on a display surface DD-IS. The display surface DD-IS is parallel to a plane defined by a first direction axis DR1 and a second direction axis DR2. A normal direction of the display surface DD-IS, in other words, a thickness direction of the display device DD is indicated by a third direction axis DR3.

A front surface (or a top surface) and a rear surface (or a bottom surface) of each member or unit to be described below are distinguished by the third direction axis DR3. However, the first to third direction axes DR1 to DR3 illustrated in this embodiment are merely examples. Hereinafter, first to third directions are directions respectively indicated by the first to third direction axes DR1 to DR3, and refer to the same reference numerals.

The display device DD is illustrated to have a planar display surface in an exemplary embodiment of the present invention, but is not limited thereto. The display device DD may further include a curved display surface. The display device DD may also include a three-dimensional display surface. The three-dimensional display surface may include a plurality of display areas indicating different directions, and may also include, for example, a polygonal columnar display surface.

The display device DD according to an exemplary embodiment of the present invention may be a rigid display device. However, the display device DD according to another exemplary embodiment of the present invention is not limited thereto, and may be a flexible display device. The flexible display device may include a foldable display device, or a bending type display device having a bendable area.

FIG. 1 exemplarily illustrates, in an exemplary embodiment of the present invention, the display device DD applicable to a mobile phone. It is to be understood that electronic modules, a camera module, a power supply module, and the like mounted on a main board may be disposed in a bracket/case together with the display device DD to constitute a mobile phone. The display device DD according to an exemplary embodiment of the present invention may be applied to a large-sized electronic device such as a television and a monitor, and to medium- and small-sized electronic devices such as a tablet, a car navigation device, a game machine, and a smart watch.

As illustrated in FIG. 1, the display surface DD-IS includes an image area DD-DA in which the image IM is displayed and a bezel area DD-NDA adjacent to the image area DD-DA. The bezel area DD-NDA is an area where no image is displayed. Icon images are illustrated in FIG. 1 as an example of the image IM.

As illustrated in FIG. 1, the image area DD-DA may have a substantially quadrangular shape. The "substantially quadrangular shape" may include not only a quadrangular shape in a mathematical sense, but also a quadrangular shape in which a curved boundary instead of a vertex is defined in a vertex area (or corner area).

The bezel area DD-NDA may surround the image area DD-DA. However, an exemplary embodiment of the present invention is not limited thereto, and the image area DD-DA and the bezel area DD-NDA may have different shapes. The bezel area DD-NDA may be disposed on only one side of the image area DD-DA. The bezel area DD-NDA may not be exposed to the outside depending on the form of combination of the display device DD and other components of a corresponding electronic device.

The display device DD according to an exemplary embodiment of the present invention may sense a user input TC applied from the outside. The user input TC may be any one or a combination of various types of external inputs such as a part of a user's body, light, heat, and pressure. Although the user input TC is shown in this embodiment as a touch input by a user's hand that is applied to a front surface of the display device DD, this is merely exemplary and the user input TC may be one of the various types of external inputs as described above. In addition, the display device DD may sense, according to the structure thereof, a user input TC applied to a side surface or a rear surface of the display device DD, and is not limited thereto.

In addition, the display device DD according to an exemplary embodiment of the present invention may sense a fingerprint, which is an example of biometric information, as one of the types of the user input TC applied from the outside.

FIG. 2 illustrates a cross section of the display device DD in a plane defined by the first direction axis DR1 and the third direction axis DR3. In FIG. 2, the components of the display device DD are schematically illustrated to describe a laminated relationship thereof.

The display device DD according to an exemplary embodiment of the present invention may include a display panel DP, an input sensor ISL, an anti-reflector RPP, and a window WP. At least some components of the display panel DP, the input sensor ISL, the anti-reflector RPP, and the window WP may be formed in a continuous process, or at least some components thereof may be bonded to each other by an adhesive member. An adhesive member ADS may be an optically clear adhesive member such as a pressure sensitive adhesive film (PSA), an optically clear adhesive film (OCA), and an optically clear resin (OCR). The adhesive member to be described below may include a typical adhesive or a detachable adhesive. In an exemplary embodiment of the present invention, the anti-reflector RPP and the window WP may be replaced by other components or omitted.

In FIG. 2, the input sensor ISL is disposed directly on the display panel DP. As used herein, "a component B is disposed directly on a component A" may mean that no separate adhesive layer/adhesive member is disposed between the component A and the component B. The component B is formed through a continuous process on a base surface provided by the component A after the component A has been formed.

In this exemplary embodiment, the anti-reflector RPP and the window WP are of a "panel" type, and the input sensor ISL is of a "layer" type. The "panel" type may include a base layer, which provides a base surface, such as a synthetic resin film, a composite film, and a glass substrate, but the base layer may be omitted in the "layer" type. In other words, components of the "layer" type may be disposed on a base surface another component provides. In an exemplary embodiment of the present invention, the anti-reflector RPP and the window WP may also be of the "layer" type. In an exemplary embodiment of the present invention, an input sensor ISL may be of the "panel" type. The input sensor ISL of the "panel" type may be manufactured in a separate process, and then may be disposed directly on a display panel DP or bonded to the display panel DP with an adhesive layer therebetween.

The display panel DP generates an image, and the input sensor ISL obtains coordinate information of an external input (e.g., a touch event). A protective member disposed on a bottom surface of the display panel DP may further be included in the display device DD according to an exemplary embodiment of the present invention. The protective member and the display panel DP may be bonded by an adhesive member.

The display device DD according to an exemplary embodiment of the present invention includes the input sensor ISL disposed on a top surface of the display panel DP, but the invention is not limited thereto. In another exemplary embodiment of the present invention, a display device DD may not include an input sensor ISL.

The display panel DP according to an exemplary embodiment of the present invention may be a light emitting display panel, but is not limited thereto. For example, the display panel DP may be an organic light emitting display panel or a quantum dot light emitting display panel. The panels described above are classified depending on a constituent material of a light emitting element. A light emitting layer of an organic light emitting display panel may include an organic light emitting material. A light emitting layer of a quantum dot light emitting display panel may include a quantum dot, a quantum rod, or the like. Hereinafter, the display panel DP is described as an organic light emitting display panel.

The anti-reflector RPP reduces the reflectance of external light incident from above the window WP. The anti-reflector RPP according to an exemplary embodiment of the present invention may include a phase retarder and a polarizer. The phase retarder may be of a film type or a liquid crystal coating type, and may include a $\lambda/2$ phase retarder and/or a $\lambda/4$ phase retarder. The polarizer may also be of the film type or the liquid crystal coating type. The film type may include a stretched synthetic resin film, and the liquid crystal coating type may include liquid crystals aligned in a predetermined alignment. The phase retarder and the polarizer may further include a protective film. The phase retarder and the polarizer themselves or the protective film may be a base layer of the anti-reflector RPP.

The anti-reflector RPP according to an exemplary embodiment of the present invention may include color filters. The color filters have a predetermined arrangement. The arrangement of the color filters may be determined in consideration of the light emission colors of pixels included in the display panel DP. The anti-reflector RPP may further include a black matrix adjacent to the color filters.

The anti-reflector RPP according to an exemplary embodiment of the present invention may include a destructive interference structure. For example, the destructive interference structure may include a first reflective layer and a second reflective layer disposed on different layers. First reflected light and second reflected light respectively reflected by the first reflective layer and the second reflective layer may interfere destructively with each other, thereby reducing the reflectance of external light.

The window WP according to an exemplary embodiment of the present invention includes a base layer WP-BS and a light shielding pattern WP-BZ. The base layer WP-BS may include a glass substrate, a synthetic resin film, or the like. The base layer WP-BS is not limited to a single layer. The base layer WP-BS may include two or more films bonded by an adhesive member.

The light shielding pattern WP-BZ partially overlaps the base layer WP-BS. The light shielding pattern WP-BZ may be disposed on a rear surface of the base layer WP-BS, and may substantially define the bezel area DD-NDA of the display device DD. In other words, the base layer WP-BS may be formed in the bezel area DD-NDA of the display device DD. An area in which the light shielding pattern WP-BZ is not disposed may be the image area DD-DA of the display device DD. When describing the window WP, an area in which the light shielding pattern WP-BZ is disposed is a light shielding area of the window WP, and the area in which the light shielding pattern WP-BZ is not disposed is a transmissive area of the window WP.

The light shielding pattern WP-BZ may have a multilayer structure. The multilayer structure may include a color layer having a chromatic color and a light shielding layer having an achromatic color (e.g., black). The color layer having a chromatic color and the light shielding layer having an achromatic color may be formed through a deposition, printing, or coating process. A functional coating layer disposed on a front surface of the base layer WP-BS may further be included in the window WP. The functional coating layer may include an anti-fingerprint layer, an anti-reflection layer, a hard coating layer, and the like.

Figure 3:
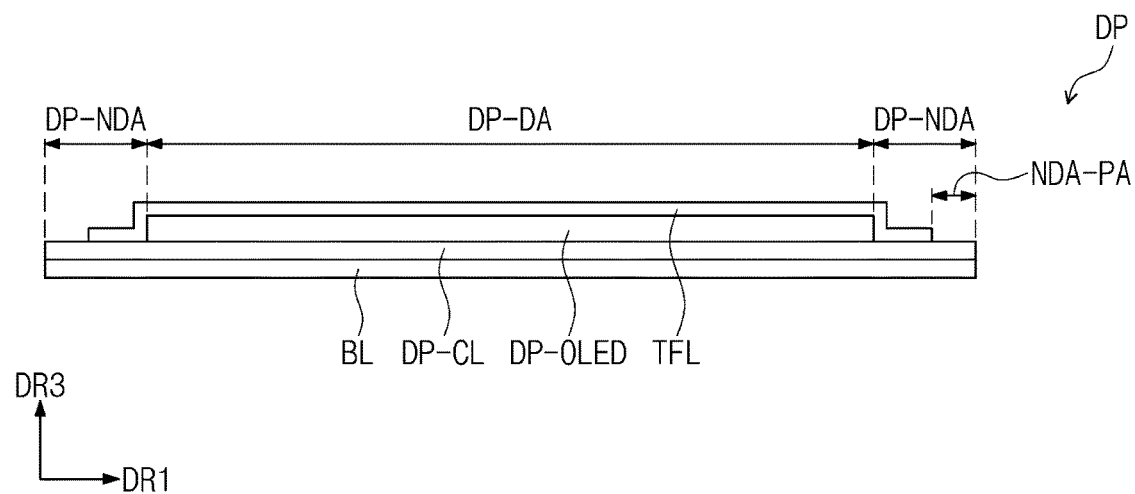
FIG. 3 is a cross-sectional view of a display panel according to an exemplary embodiment of the present invention.

FIG. 3 is a cross-sectional view of the display panel DP according to an exemplary embodiment of the present invention.

As illustrated in FIG. 3, the display panel DP includes a base layer BL, and a circuit element layer DP-CL, a display element layer DP-OLED, and an upper insulating layer TFL that are disposed on the base layer BL. A display area DP-DA and a non-display area DP-NDA respectively corresponding to the image area DD-DA and the bezel area DD-NDA illustrated in FIG. 1 may be in the display panel DP. As used herein, "an area/part and another area/part correspond" may mean "the two areas/parts overlap each other", but is not limited to having the same surface area and/or the same shape. In other words, the two overlapping areas/parts may not have the same surface area and/or the same shape.

The base layer BL may include at least one synthetic resin film. The base layer BL may include a glass substrate, a metal substrate, an organic/inorganic composite substrate, or the like.

The circuit element layer DP-CL includes at least one insulating layer and a circuit element. The insulating layer includes at least one inorganic layer and at least one organic layer. The circuit element includes signal lines, a pixel driving circuit, and the like.

The display element layer DP-OLED includes at least organic light emitting diodes as a light emitting element. The display element layer DP-OLED may further include an organic layer such as a pixel defining film.

The upper insulating layer TFL includes a plurality of thin films. Some of the thin films are disposed to enhance optical efficiency, while other thin films are disposed to protect each of the organic light emitting diodes. A detailed description of the upper insulating layer TFL will be given later.

Figure 4:
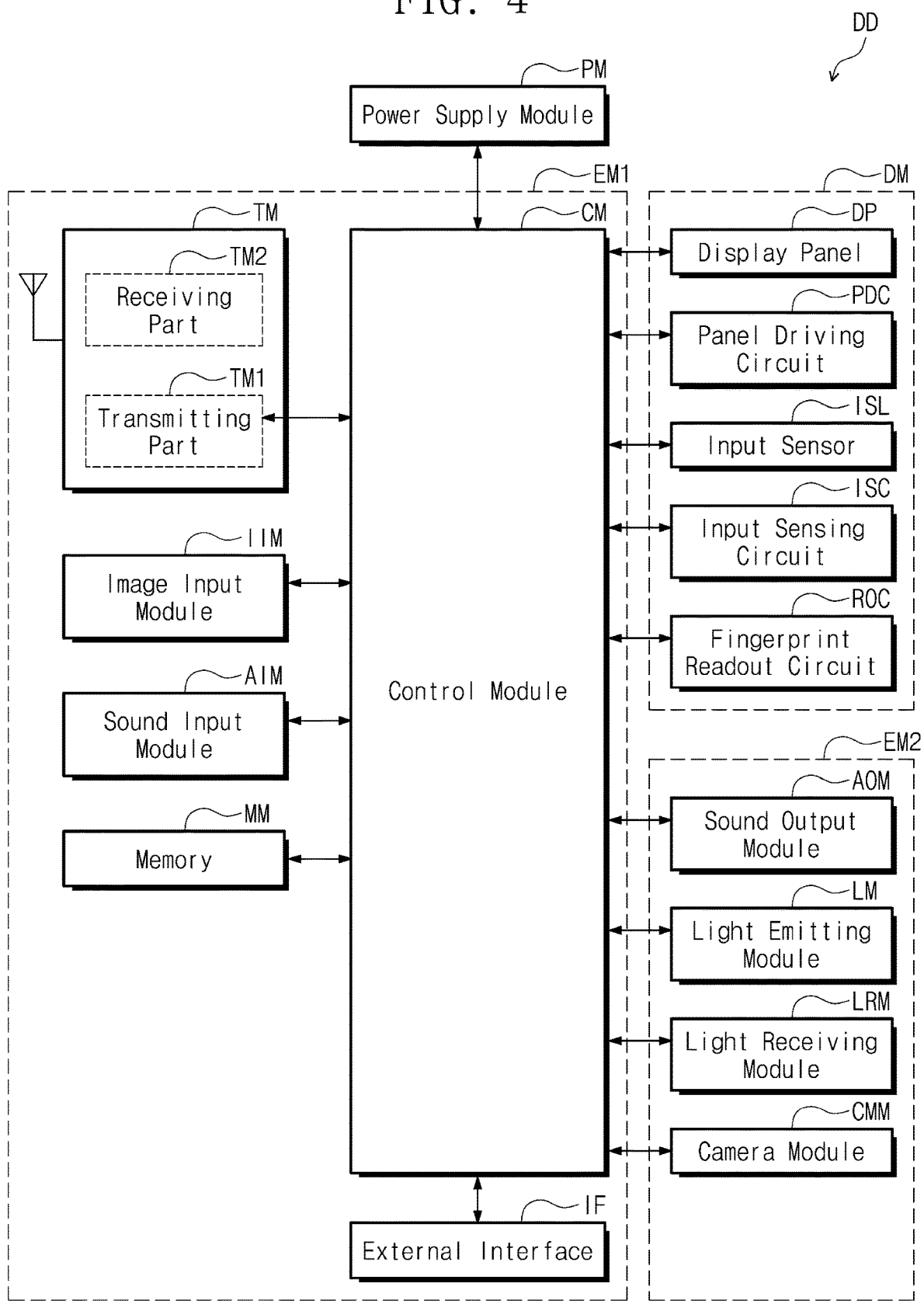
FIG. 4 is a block diagram of the display device illustrated in FIG. 1.

FIG. 4 is a block diagram of the display device DD illustrated in FIG. 1.

Referring to FIG. 4, the display device DD may include a display module DM, a power supply module PM, a first electronic module EM1 and a second electronic module EM2. The display module DM, the power supply module PM, the first electronic module EM1, and the second electronic module EM2 may be electrically connected to each other.

The display module DM illustrated in FIG. 4 may include the display panel DP and the input sensor ISL illustrated in FIG. 2. In addition, the display module DM may further include a panel driving circuit PDC, an input sensing circuit ISC, and a fingerprint readout circuit ROC.

The power supply module PM supplies power required for an overall operation of the display device DD. The power supply module PM may include a battery module.

The first electronic module EM1 and the second electronic module EM2 include various functional modules for operating the display device DD. The first electronic module EM1 may be mounted directly on a motherboard electrically connected to the display module DM, or may be mounted on a separate board to be electrically connected to the motherboard through a connector or the like.

The first electronic module EM1 may include a control module CM, a wireless communication module TM, an image input module IIM, a sound input module AIM, memory MM, and an external interface IF. Some of the modules may also be electrically connected to the motherboard through a flexible circuit board instead of being mounted on the motherboard.

The control module CM controls the overall operation of the display device DD. The control module CM may be a microprocessor. For example, the control module CM activates or deactivates the display module DM. The control module CM may control other modules such as the image input module IIM and the sound input module AIM, on the basis of a touch signal received from the display module DM. The control module CM may perform user authentication on the basis of a fingerprint signal received from the fingerprint readout circuit ROC.

The wireless communication module TM may transmit/receive a radio signal to/from another terminal by using a Bluetooth or Wi-Fi channel. The wireless communication module TM is not limited to Bluetooth or Wi-Fi and may transmit/receive a radio signal via a variety of other short range wireless techniques. The wireless communication module TM may transmit/receive a voice signal to/from a repeater by using a communication channel. The wireless communication module TM includes a transmitting part TM1 for modulating and transmitting a signal to be transmitted, and a receiving part TM2 for demodulating a received signal.

The image input module IIM processes an image signal and converts the processed image signal into image data that may be displayed on the display module DM. The sound input module AIM receives an external sound signal using a microphone in a recording mode, a voice recognition mode, or the like, and converts the received external sound signal into electrical voice data.

The external interface IF serves as an interface to which an external charger, a wired/wireless data port, a card socket (e.g., a memory card and a subscriber identification module (SIM)/user identity module (UIM) card), or the like are connected.

The second electronic module EM2 may include a sound output module AOM, a light emitting module LM, a light receiving module LRM, a camera module CMM, or the like. The components described above may be mounted directly on the motherboard, may be mounted on a separate board to be electrically connected to the display module DM via a connector or the like, or may be electrically connected to the first electronic module EM1.

The sound output module AOM converts sound data received from the wireless communication module TM or stored in the memory MM, and outputs the converted sound data to the outside.

The light emitting module LM generates and outputs light. The light emitting module LM may output infrared rays. The light emitting module LM may include a light emitting diode (LED) element. The light receiving module LRM may sense infrared rays. The light receiving module LRM may be activated when infrared rays having a predetermined level or higher are sensed. The light receiving module LRM may include a complementary metal oxide semiconductor (CMOS) sensor. After infrared rays generated by the light emitting module LM are outputted, the infrared rays may be reflected by an external object (e.g., a user's finger or face), and the reflected infrared rays may be incident on the light receiving module LRM. The camera module CMM captures an external image.

Figure 5:
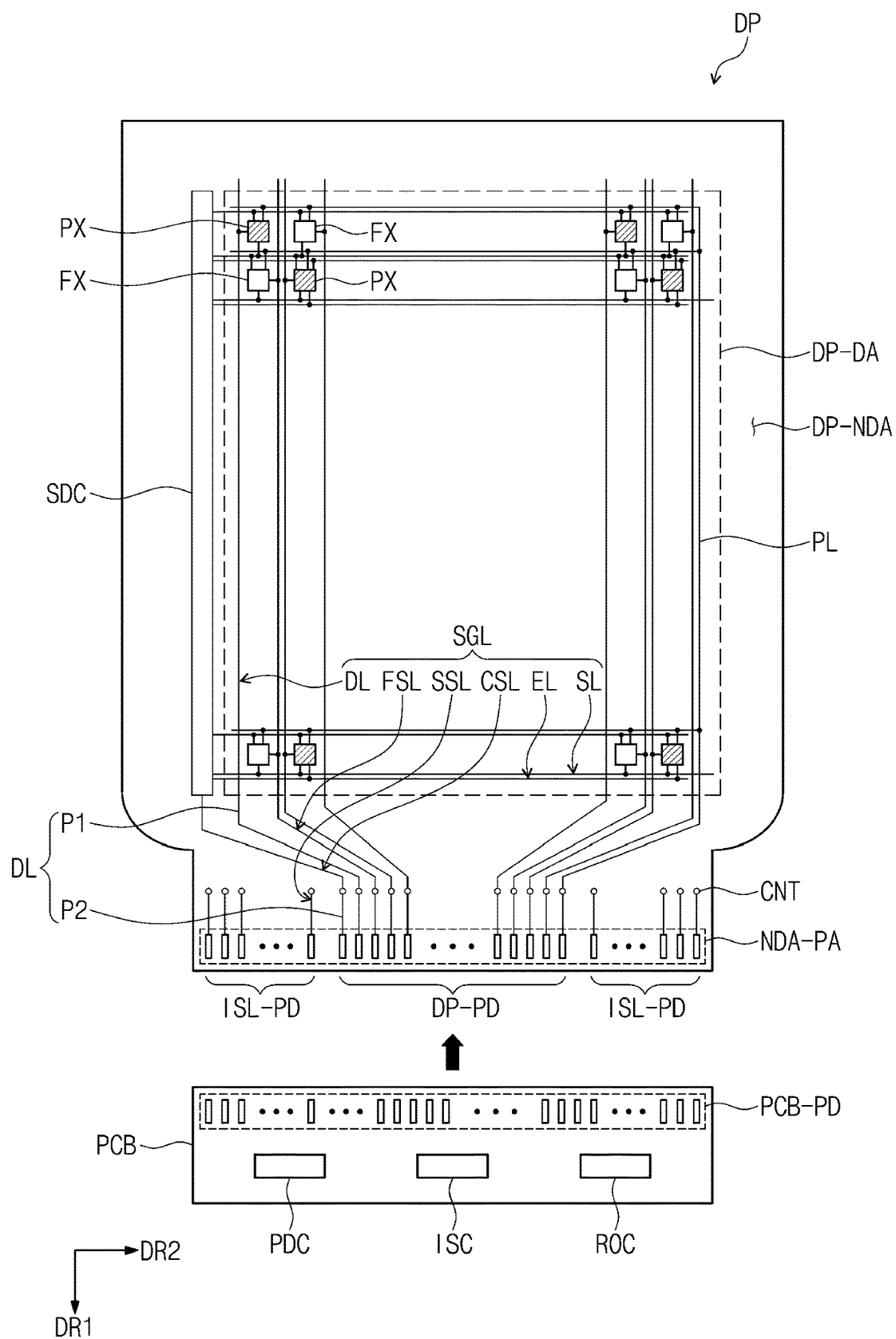
FIG. 5 is a plan view of a display panel according to an exemplary embodiment of the present invention.

FIG. 5 is a plan view of the display panel DP according to an exemplary embodiment of the present invention.

As illustrated in FIG. 5, the display panel DP may include a scan driving circuit SDC, a plurality of signal lines SGL (hereinafter referred to as signal lines SGL), a plurality of signal pads DP-PD and ISL-PD (hereinafter referred to as signal pads DP-PD and ISL-PD), a plurality of light emitting pixels PX (hereinafter referred to as pixels PX), and a plurality of light sensing pixels FX (hereinafter referred to as light sensing pixels FX). The light sensing pixels FX may be fingerprint sensing pixels for sensing a fingerprint by the user input TC (see FIG. 1).

The scan driving circuit SDC generates a plurality of scan signals (hereinafter referred to as scan signals), and sequentially outputs the scan signals to a plurality of scan lines SL (hereinafter referred to as scan lines SL) to be described later. The scan driving circuit SDC may further output another control signal to a driving circuit of each of the light emitting pixels PX.

The scan driving circuit SDC may include a plurality of transistors formed through a process the same as that of the driving circuit of each of the light emitting pixels PX. In addition, each of the transistors included in the scan driving circuit SDC and transistors included in the light emitting pixels PX may be a P-type transistor having a low temperature polycrystalline silicon (LTPS) semiconductor layer or an N-type transistor having an oxide semiconductor as a semiconductor layer. In an exemplary embodiment of the present invention, some of transistors included in a scan driving circuit SDC and light emitting pixels PX may be P-type transistors, while others may be N-type transistors.

The signal lines SGL include the scan lines SL, data lines DL, a power line PL, a fingerprint sensing line FSL, and a control signal line CSL. Each of the scan lines SL is connected to a corresponding light emitting pixel PX of the light emitting pixels PX, and each of the data lines DL is connected to a corresponding light emitting pixel PX of the light emitting pixels PX. The power line PL is connected to the light emitting pixels PX. The control signal line CSL may provide control signals to the scan driving circuit SDC.

In an exemplary embodiment of the present invention, the signal lines SGL may further include auxiliary lines SSL.

The auxiliary lines SSL are signal lines connected to the input sensor ISL (see FIG. 2). The auxiliary lines SSL may be omitted.

The signal lines SGL may include a plurality of parts disposed on different layers. FIG. 5 illustrates the data lines DL each including two parts P1 and P2. The parts P1 and P2 may be connected to each other through one of contact holes CNT. The auxiliary lines SSL are connected to signal lines of the input sensor ISL (see FIG. 6), which will be described later, through corresponding ones of the contact holes CNT.

The signal pads DP-PD and ISL-PD may include first type signal pads DP-PD connected to the data lines DL, the power line PL, and the control signal line CSL, and second type signal pads ISL-PD connected to the auxiliary lines SSL. The first type signal pads DP-PD and the second type signal pads ISL-PD are arranged adjacent to each other in a pad area NDA-PA in a portion of the non-display area DP-NDA. The laminated structures or constituent materials of the signal pads DP-PD and ISL-PD may not be distinguished from each other, and the signal pads DP-PD and ISL-PD may be formed through the same process.

The display area DP-DA may be an area in which the light emitting pixels PX and the light sensing pixels FX are arranged. A plurality of electronic elements are disposed in the display area DP-DA. The electronic elements include a light emitting pixel driving circuit connected to the organic light emitting diode provided in each of the light emitting pixels PX, and a light sensing pixel driving circuit connected to an organic photodiode provided in each of the light sensing pixels FX. The scan driving circuit SDC, the signal lines SGL, the signal pads DP-PD and ISL-PD, the light emitting pixel driving circuit, and the light sensing pixel driving circuit may be included in the circuit element layer DP-CL illustrated in FIG. 3.

The light emitting pixel PX and the light sensing pixel FX will be described in detail later. FIG. 5 additionally illustrates a circuit board PCB electrically connected to the display panel DP. The circuit board PCB may be a rigid circuit board or a flexible circuit board.

The panel driving circuit PDC for controlling the operation of the display panel DP may be disposed on the circuit board PCB. In addition, the input sensing circuit ISC for controlling the input sensor ISL and the fingerprint readout circuit ROC may be disposed on the circuit board PCB. Each of the panel driving circuit PDC, the input sensing circuit ISC, and the fingerprint readout circuit ROC may be mounted on the circuit board PCB in the form of an integrated chip. In an exemplary embodiment of the present invention, a panel driving circuit PDC, an input sensing circuit ISC, and a fingerprint readout circuit ROC may be mounted on a circuit board PCB in the form of a single integrated chip. The circuit board PCB may include circuit board pads PCB-PD electrically connected to the signal pads DP-PD and ISL-PD. Signal lines connecting the circuit board pads PCB-PD to the panel driving circuit PDC and/or the input sensing circuit ISC may further be included in the circuit board PCB. In addition, the circuit board pads PCB-PD may include at least one output pad and at least one input pad.

The fingerprint readout circuit ROC may receive a fingerprint sensing signal through the fingerprint sensing line FSL.

The signal pads DP-PD and ISL-PD of the display panel DP and the circuit board pads PCB-PD may be directly connected to each other. In another exemplary embodiment of the present invention, signal pads DP-PD and ISL-PD and circuit board pads PCB-PD may be electrically connected through a connecting board such as an anisotropic conductive film.

In an exemplary embodiment of the present invention, a panel driving circuit PDC may be mounted in a non-display area DP-NDA of a display panel DP instead of a circuit board PCB.

A portion of the display panel DP illustrated in FIG. 5 may be bent. A portion of the non-display area DP-NDA may be bent, and may be bent around a bending axis parallel to the second direction DR2. The bending axis may overlap the parts P2 of the data lines DL and the auxiliary lines SSL. Light emission control lines EL are further shown in FIG. 5 and may be connected to the light emitting pixels PX.

Figure 6:
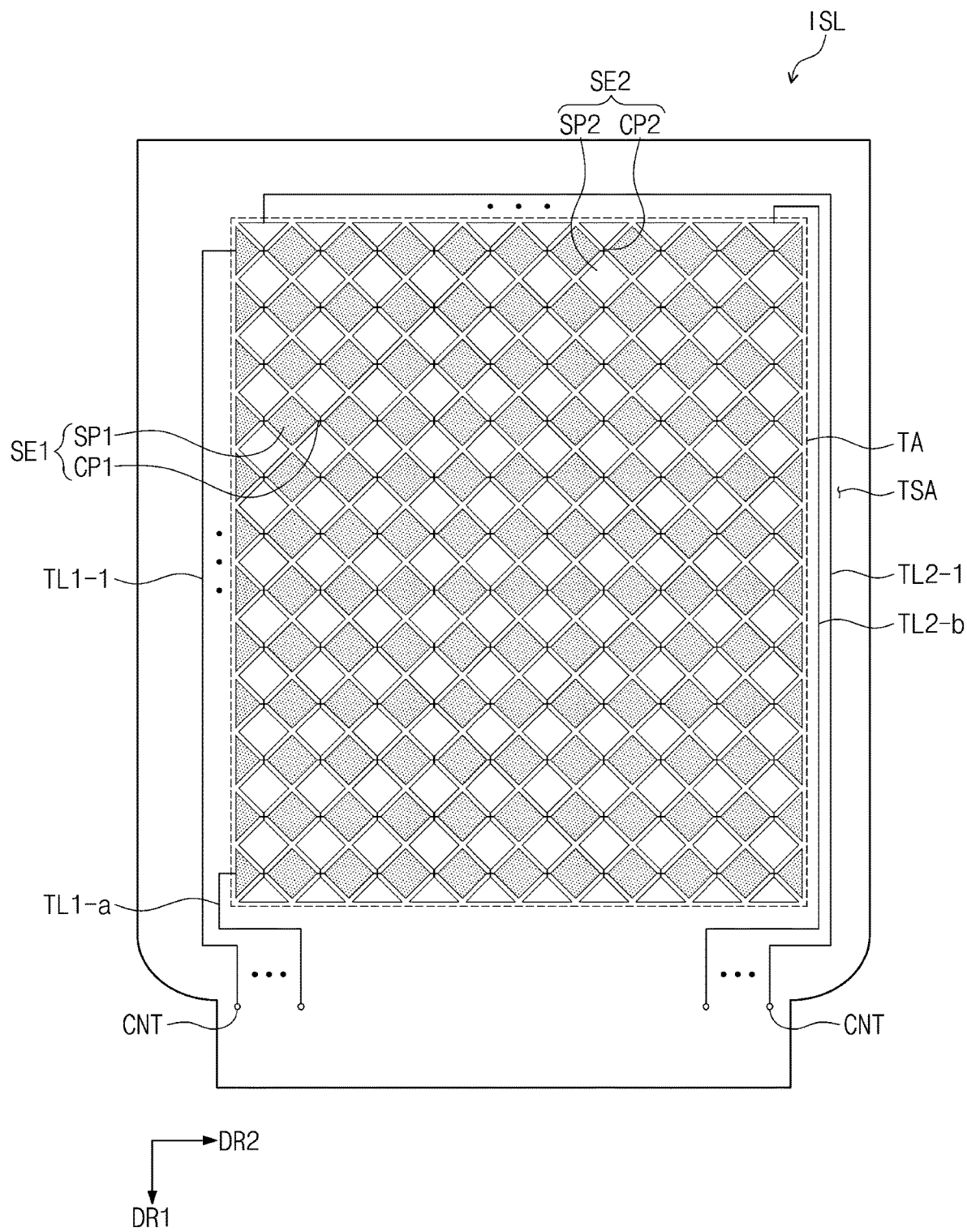
FIG. 6 is a plan view of a touch sensing unit according to an exemplary embodiment of the present invention.

FIG. 6 is a plan view of the input sensor ISL according to an exemplary embodiment of the present invention.

Referring to FIG. 6, the input sensor ISL is disposed on the display panel DP illustrated in FIG. 5. The input sensor ISL may sense the user input TC (illustrated in FIG. 1) to obtain position or strength information of the external touch input. The input sensor ISL may include a sensing area TA and a wiring area TSA when viewed in a plane. The sensing area TA may be an area in which first sensing electrodes SE1 and second sensing electrodes SE2 are arranged. In an exemplary embodiment of the present invention, the wiring area TSA may be disposed along the edge of the sensing area TA. The sensing area TA and the wiring area TSA may respectively correspond to the display area DP-DA and the non-display area DP-NDA of the display panel DP illustrated in FIG. 5.

In an exemplary embodiment of the present invention, the input sensor ISL may be a capacitive touch sensor. One of the first sensing electrodes SE1 and the second sensing electrodes SE2 receives a driving signal, and the other thereof outputs the amount of change in capacitance between the first sensing electrodes SE1 and the second sensing electrodes SE2 as a sensing signal.

Each of the first sensing electrodes SE1 has a shape extending in the second direction DR2. In addition, the first sensing electrodes SE1 may be sequentially arranged in the first direction DR1. The first sensing electrodes SE1 may include a plurality of first sensing patterns SP1 and a plurality of first connection patterns CP1.

Each of the second sensing electrodes SE2 has a shape extending in the first direction DR1. In addition, the second sensing electrodes SE2 may be sequentially arranged in the second direction DR2. The second sensing electrodes SE2 may include a plurality of second sensing patterns SP2 and a plurality of second connection patterns CP2.

First sensing lines TL1-1 to TL1-a may include signal lines the number of which is the same as the number of the first sensing electrodes SE1. Each of the first sensing lines TL1-1 to TL1-a may be connected to at least one of opposite ends of a corresponding one of the first sensing electrodes SE1. Second sensing lines TL2-1 to TL2-b may include signal lines the number of which is the same as the number of the second sensing electrodes SE2. Each of the second sensing lines TL2-1 to TL2-b may be connected to at least one of opposite ends of a corresponding one of the second sensing electrodes SE2.

The first sensing lines TL1-1 to TL1-a may be respectively connected to some of the auxiliary lines SSL (see FIG. 5) disposed on one side of the pad area NDA-PA (see FIG. 5) through corresponding ones of the contact holes CNT. The second sensing lines TL2-1 to TL2-b may be respectively connected to some of the auxiliary lines SSL (see FIG.

5) disposed on the other side of the pad area NDA-PA (see FIG. 5) through corresponding ones of the contact holes CNT.

The contact holes CNT penetrate insulating layers disposed between the first sensing lines TL1-1 to TL1-a and the second sensing lines TL2-1 to TL2-b, and the auxiliary lines SSL.

Figure 7:
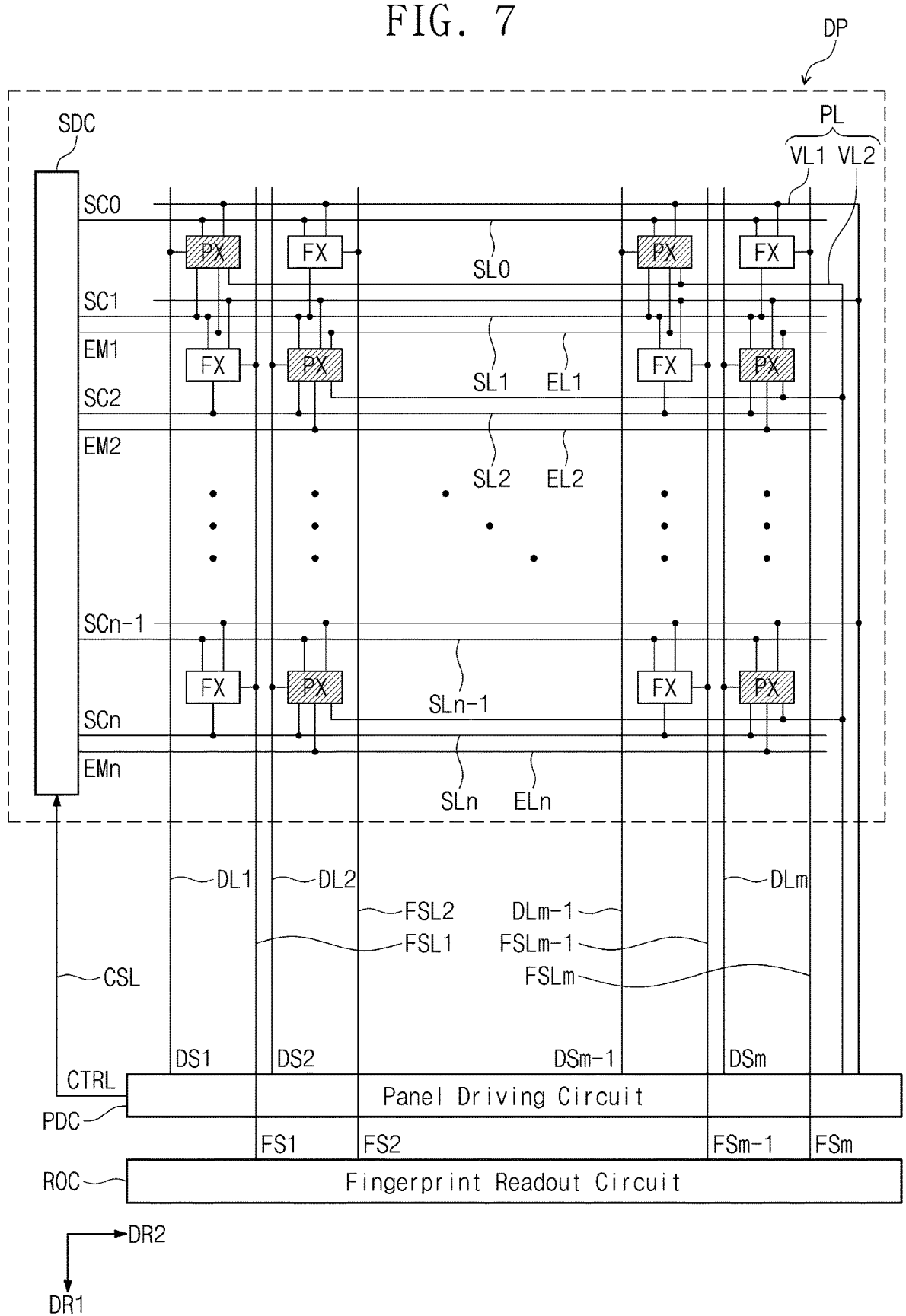
FIG. 7 illustrates a connection relationship between a plurality of light emitting pixels, a plurality of light sensing pixels, and signal lines of the display panel illustrated in FIG. 5.

FIG. 7 illustrates a connection relationship between the light emitting pixels PX, the light sensing pixels FX, and the signal lines SGL of the display panel DP illustrated in FIG. 5.

Referring to FIG. 7, the panel driving circuit PDC provides a control signal CTRL to the scan driving circuit SDC through the control signal line CSL. The scan driving circuit SDC outputs a plurality of scan signals SC0 to SCn to a plurality of scan lines SL0 to SLn in response to the control signal CTRL. The plurality of scan signals SC0 to SCn may be pulse signals sequentially having an active level. The scan driving circuit SDC outputs a plurality of light emission control signals EM1 to EMn to a plurality of light emission control lines EL1 to ELn in response to the control signal CTRL. The plurality of light emission control signals EM1 to EMn may be pulse signals sequentially having an active level. Here, m and n are each a positive integer.

The panel driving circuit PDC outputs data signals DS1 to DSm to a plurality of data lines DL1 to DLm. The data signals DS1 to DSm may be signals having gradation voltages corresponding to an image to be displayed in the light emitting pixels PX.

The fingerprint readout circuit ROC receives fingerprint sensing signals FS1 to FSm from a plurality of fingerprint sensing lines FSL1 to FSLm.

The light emitting pixels PX and the light sensing pixels FX are alternately and sequentially arranged in the first direction DR1, and the light emitting pixels PX and the light sensing pixels FX are alternately and sequentially arranged in the second direction DR2. In other words, light sensing pixels FX may be respectively disposed on the immediate left, right, upper, and lower sides of a particular light emitting pixel PX. In addition, light emitting pixels PX may be respectively disposed on the immediate left, right, upper, and lower sides of a particular light sensing pixel FX. However, the arrangement order and the repetition period of the light emitting pixels PX and the light sensing pixels FX are not limited to the example illustrated in FIG. 7 and may be variously changed. In an exemplary embodiment of the present invention, two light emitting pixels PX and one light sensing pixel FX may be alternately and sequentially arranged in the first direction DR1.

Each of the light emitting pixels PX is connected to two adjacent scan lines of the scan lines SL0 to SLn, a corresponding light emission control line of the light emission control lines EL1 to ELn, a corresponding data line of the data lines DL1 to DLm, a first voltage line VL1, and a second voltage line VL2. The first voltage line VL1 and the second voltage line VL2 may be included in the power line PL illustrated in FIG. 5. The first voltage line VL1 may be a voltage line for transmitting a second driving voltage ELVDD, and the second voltage line VL2 may be a voltage line for transmitting an initialization voltage VINIT. A third voltage line VL3 (see FIG. 8) as well as the first voltage line VL1 and the second voltage line VL2 may further be included in the power line PL (see FIG. 5). The third voltage line VL3 may be electrically connected to both the light emitting pixels PX and the light sensing pixels FX to provide a first driving voltage ELVSS (see FIG. 8) to the light emitting pixels PX and the light sensing pixels FX.

Each of the light sensing pixels FX is connected to two adjacent scan lines of the scan lines SL0 to SLn, a corresponding fingerprint sensing line of the fingerprint sensing lines FSL1 to FSLm, and the first voltage line VL1.

Figure 8:
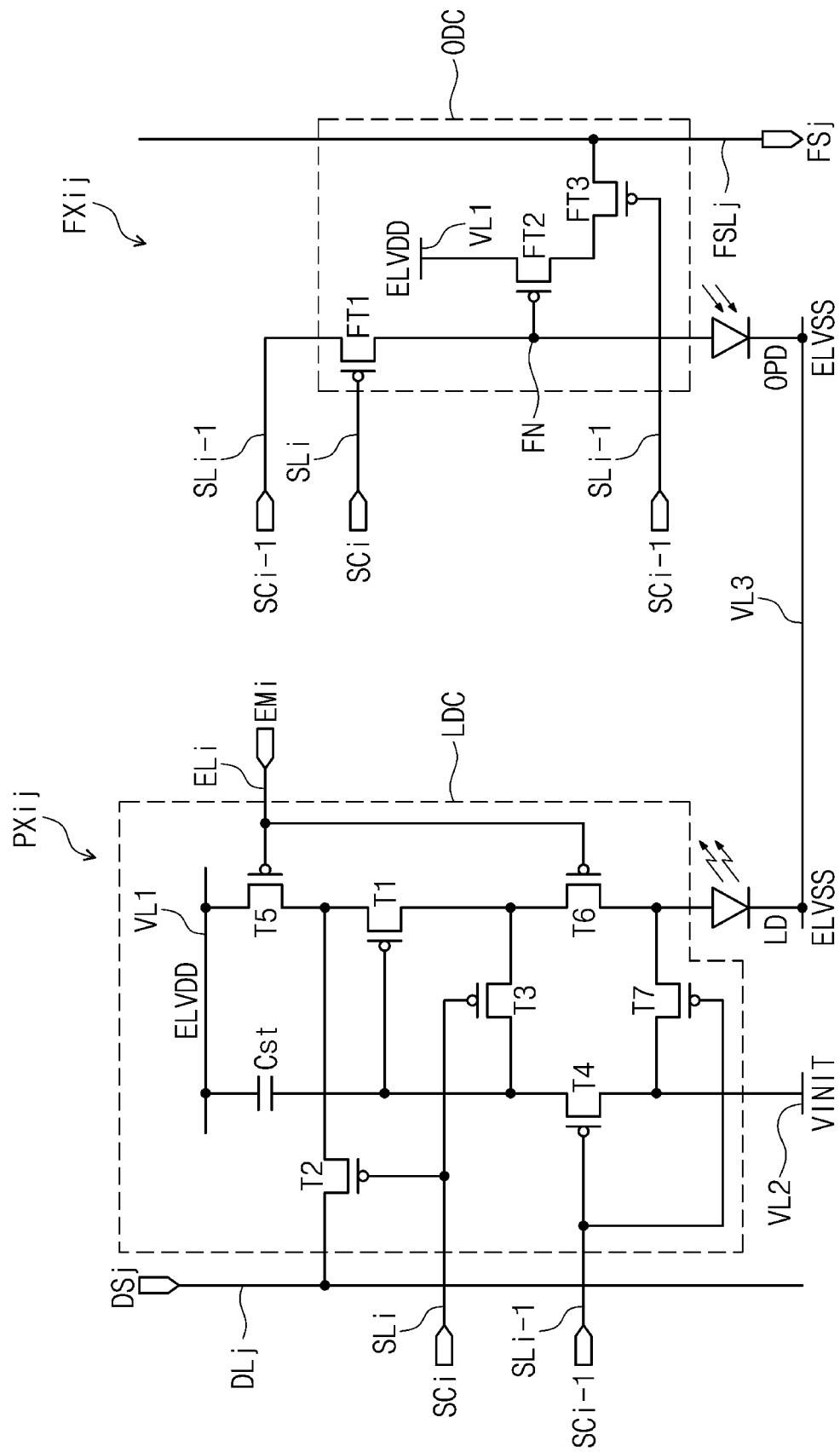
FIG. 8 illustrates a circuit configuration of a light emitting pixel among the plurality of light emitting pixels and a corresponding light sensing pixel among the plurality of light sensing pixels, illustrated in FIG. 7.

FIG. 8 illustrates a circuit configuration of a light emitting pixel PXij among the plurality of light emitting pixels PX and a corresponding light sensing pixel FXij among the plurality of light sensing pixels FX, illustrated in FIG. 7.

Each of the plurality of light emitting pixels PX illustrated in FIG. 7 may have the same circuit configuration as the light emitting pixel PXij illustrated in FIG. 8. In addition, each of the plurality of light sensing pixels FX illustrated in FIG. 7 may have the same circuit configuration as the light sensing pixel FXij illustrated in FIG. 8.

The light emitting pixel PXij illustrated in FIG. 8 is connected to the j-th data line DLj of the plurality of data lines DL1 to DLm, the (i−1)-th scan line SLi-1 and the i-th scan line SLi of the plurality of scan lines SL0 to SLn, and the i-th light emission control line ELi of the plurality of light emission control lines EL1 to ELn. The light sensing pixel FXij illustrated in FIG. 8 is connected to the j-th fingerprint sensing line FSLj of the plurality of fingerprint sensing lines FSL1 to FSLm, and the i-th scan line SLi and the (i−1)-th scan line SLi-1 of the plurality of scan lines SL0 to SLn.

The light emitting pixel PXij includes an organic light emitting diode LD and a light emission driving circuit LDC.

In an exemplary embodiment of the present invention, the light emission driving circuit LDC of the light emitting pixel PXij includes seven transistors T1, T2, T3, T4, T5, T6 and T7 and one capacitor Cst. In addition, first to seventh transistors T1 to T7 may be P-type transistors such as a p-type MOS (PMOS) transistor, but are not limited thereto. At least one of the first to seventh transistors T1 to T7 may be an N-type transistor such as an n-type MOS (NMOS) transistor. In addition, the circuit configuration of the light emitting pixel PXij according to an exemplary embodiment of the present invention is not limited to the circuit configuration illustrated in FIG. 8. The light emission driving circuit LDC illustrated in FIG. 8 is merely an example, and the configuration of the light emission driving circuit LDC may be modified.

Referring to FIG. 8, the light emitting pixel PXij of the display device according to an exemplary embodiment of the present invention may include the first to seventh transistors T1 to T7, the capacitor Cst, and at least one organic light emitting diode LD that are connected to the j-th data line DLj, the (i−1)-th scan line SLi-1, the i-th scan line SLi, the i-th light emission control line ELi, and the first, second, and third voltage lines VL1, VL2, and VL3. In an exemplary embodiment of the present invention, an example is described in which the one light emitting pixel PXij includes the one organic light emitting diode LD.

The (i−1)-th scan line SLi-1 may transmit a second scan signal SCi-1, and the i-th scan line SLi may transmit a first scan signal SCi. The first and second scan signals SCi and SCi-1 may transmit a gate-on voltage and a gate-off voltage capable of turning on and off the transistors T2, T3, T4, and T7 included in the pixel PXij. In an exemplary embodiment of the present invention, an example will be mainly described in which the (i−1)-th scan line SLi-1 transmits a gate-on voltage at a timing earlier than that of the i-th scan line SLi.

The light emission control line ELi may transmit the light emission control signal EMi capable of controlling light emission of the organic light emitting diode LD. The light emission control signal EMi transmitted by the light emission control line ELi may have a waveform different from the waveform of the first and second scan signals SCi and SCi-1 transmitted by the i-th and (i−1)-th scan lines SLi and SLi-1. The data line DLj transmits the data signal DSj. The first voltage line VL1 transmits the second driving voltage ELVDD, the second voltage line VL2 transmits the initialization voltage VINIT, and the third voltage line VL3 transmits the first driving voltage ELVSS.

A gate electrode of the first transistor T1 is connected to a first end of the capacitor Cst, a source electrode of the first transistor T1 is connected to the first voltage line VL1 via the fifth transistor T5, and a drain electrode of the first transistor T1 is electrically connected to an anode AE (see FIG. 13) of the organic light emitting diode LD via the sixth transistor T6. The first transistor T1 may receive the data signal DSj the data line DLj transmits according to a switching operation of the second transistor T2, and may supply a driving current to the organic light emitting diode LD.

A gate electrode of the second transistor T2 is connected to the i-th scan line SLi, a source electrode of the second transistor T2 is connected to the data line DLj, and a drain electrode of the second transistor T2 is connected to the source electrode of the first transistor T1 and is connected to the first voltage line VL1 via the fifth transistor T5. The second transistor T2 may be turned on depending on the first scan signal SCi received through the i-th scan line SLi, and may transmit, to the source electrode of the first transistor T1, the data signal DSj transmitted through the data line DLj.

A gate electrode of the third transistor T3 is connected to the i-th scan line SLi. A drain electrode of the third transistor T3 is connected to a drain electrode of the fourth transistor T4, the first end of the capacitor Cst, and the gate electrode of the first transistor T1. A source electrode of the third transistor T3 is connected to the drain electrode of the first transistor T1 and is connected to the anode of the organic light emitting diode LD via the sixth transistor T6.

The third transistor T3 may be turned on depending on the first scan signal SCi received through the i-th scan line SLi, and may connect the gate electrode and the drain electrode of the first transistor T1 to each other to allow the first transistor T1 to be diode-connected.

A gate electrode of the fourth transistor T4 is connected to the (i−1)-th scan line SLi-1, a source electrode of the fourth transistor T4 is connected to the second voltage line VL2, and the drain electrode of the fourth transistor T4 is connected to the first end of the capacitor Cst and the gate electrode of the first transistor T1 via the drain electrode of the third transistor T3. The fourth transistor T4 may be turned on depending on the second scan signal SCi-1 received through the (i−1)-th scan line SLi-1, and may perform an initialization operation for initializing the voltage of the gate electrode of the first transistor T1 by transmitting the initialization voltage VINIT to the gate electrode of the first transistor T1.

A gate electrode of the fifth transistor T5 is connected to the i-th light emission control line ELi, a source electrode of the fifth transistor T5 is connected to the first voltage line VL1, and a drain electrode of the fifth transistor T5 is connected to the source electrode of the first transistor T1 and the drain electrode of the second transistor T2.

A gate electrode of the sixth transistor T6 is connected to the i-th light emission control line ELi, a source electrode of the sixth transistor T6 is connected to the drain electrode of the first transistor T1 and the source electrode of the third transistor T3, and a drain electrode of the sixth transistor T6 is electrically connected to the anode of the organic light emitting diode LD. The fifth transistor T5 and the sixth transistor T6 are turned on at the same time depending on the light emission control signal EMi received through the i-th light emission control line ELi, and as a result, the second driving voltage ELVDD may be compensated through the diode-connected first transistor T1 and transmitted to the organic light emitting diode LD.

A gate electrode of the seventh transistor T7 is connected to the (i−1)-th scan line SLi-1, a source electrode of the seventh transistor T7 is connected to the drain electrode of the sixth transistor T6 and the anode of the organic light emitting diode LD, and a drain electrode of the seventh transistor T7 is connected to the second voltage line VL2 and the source electrode of the fourth transistor T4.

As described above, the first end of the capacitor Cst is connected to the gate electrode of the first transistor T1, and a second end of the capacitor Cst is connected to the first voltage line VL1. A cathode CE (see FIG. 13) of the organic light emitting diode LD may be connected to the third voltage line VL3 that transmits the first driving voltage ELVSS. The structure of the light emitting pixel PXij according to an exemplary embodiment of the present invention is not limited to the structure illustrated in FIG. 8, and the number of transistors and the number of capacitors the light emitting pixel PXij includes and the connection relationship may be variously modified.

The light sensing pixel FXij includes an organic photodiode OPD and a light sensing driving circuit ODC.

In this embodiment, the light sensing driving circuit ODC of the light sensing pixel FXij includes three transistors FT1, FT2 and FT3. Further, a reset transistor FT1, an amplifying transistor FT2, and an output transistor FT3 may be P-type transistors such as a PMOS transistor, but are not limited thereto. At least one of the reset transistor FT1, the amplifying transistor FT2, or the output transistor FT3 may be an N-type transistor. In addition, the circuit configuration of the light sensing pixel FXij according to an exemplary embodiment of the present invention is not limited to the circuit configuration of FIG. 8. The light sensing driving circuit ODC illustrated in FIG. 8 is merely an example, and the configuration of the light sensing driving circuit ODC may be modified.

Referring to FIG. 8, the light sensing pixel FXij of the display device according to an exemplary embodiment of the present invention may include the reset transistor FT1, the amplifying transistor FT2, the output transistor FT3, and at least one organic photodiode OPD that are connected to the j-th fingerprint sensing line FSLj, the (i−1)-th scan line SLi-1, the i-th scan line SLi, the first voltage line VL1, and the third voltage line VL3. In this embodiment, an example is described in which the one light sensing pixel FXij includes the one organic photodiode OPD.

A gate electrode of the reset transistor FT1 is connected to the i-th scan line SLi, a source electrode of the reset transistor FT1 is connected to the (i−1)-th scan line SLi-1, and a drain electrode of the reset transistor FT1 is electrically connected to a charge storage node FN. The reset transistor FT1 may reset the charge storage node FN in response to the first scan signal SCi transmitted by the i-th scan line SLi.

The reset transistor FT1 may have a dual gate structure connected in series. In other words, the reset transistor FT1 may include a first sub transistor and a second sub transistor. The reset transistor FT1 may have a structure in which gate electrodes of the first sub transistor and the second sub transistor are connected to each other by a wire on a gate insulating layer, and a high concentration region having high conductivity is provided between the gate electrodes as a gate common region. A drain electrode of the first sub transistor and a source electrode of the second sub transistor may be electrically connected to each other. In addition, a source electrode of the first sub transistor may be connected to the i-th scan line SLi, and a drain electrode of the second sub transistor may be electrically connected to the charge storage node FN.

A gate electrode of the amplifying transistor FT2 is electrically connected to the charge storage node FN, a source electrode of the amplifying transistor FT2 is connected to the first voltage line VL1, and a drain electrode of the amplifying transistor FT2 is connected to a source electrode of the output transistor FT3. The amplifying transistor FT2 may be turned on by the voltage level of the charge storage node FN, and may transmit, to the source electrode of the output transistor FT3, the second driving voltage ELVDD transmitted from the first voltage line VL1.

A gate electrode of the output transistor FT3 is connected to the (i−1)-th scan line SLi-1. The source electrode of the output transistor FT3 is connected to the drain electrode of the amplifying transistor FT2. A drain electrode of the output transistor FT3 is connected to the fingerprint sensing line FSLj. The fingerprint sensing line FSLj may transmit the fingerprint sensing signal FSj.

Figure 9:
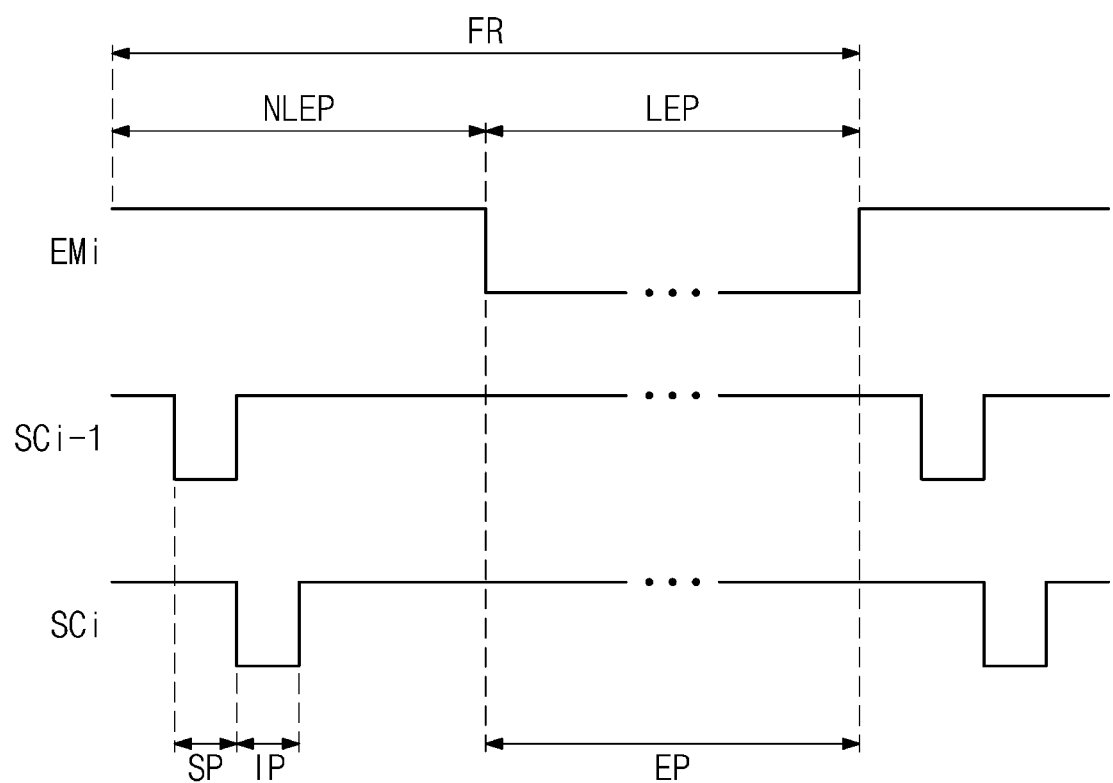
FIG. 9 is a timing diagram for describing operations of the light emitting pixel and the light sensing pixel illustrated in FIG. 8.

FIG. 9 is a timing diagram for describing operations of the light emitting pixel PXij and the light sensing pixel FXij illustrated in FIG. 8.

Referring to FIGS. 8 and 9, the first and second scan signals SCi-1 and SCi may be respectively provided in the i-th and (i−1)-th scan lines SLi-1 and SLi connected to the light emitting pixel PXij in one frame FR. The one frame FR may include a non-light emission period NLEP and a light emission period LEP according to whether the organic light emitting diode LD of the light emitting pixel PXij emits light. The non-light emission period NLEP may include an initialization period in which the second scan signal SCi-1 is at a low level, and a data writing and compensation period in which the first scan signal SCi is at a low level.

During the initialization period, the second scan signal SCi-1 having the low level is provided through the (i−1)-th scan line SLi-1. The fourth transistor T4 is turned on in response to the second scan signal SCi-1 having the low level, the initialization voltage VINIT is provided to the gate electrode of the first transistor T1 through the fourth transistor T4, and the first transistor T1 is initialized by the initialization voltage VINIT.

In addition, the seventh transistor T7 is turned on when the second scan signal SCi-1 having the low level is provided through the (i−1)-th scan line SLi-1. A portion of driving current at the drain electrode of the first transistor T1 may flow into the second voltage line VL2 through the seventh transistor T7 by the turned-on seventh transistor T7. Then, when a first scan signal SCi having the low level is provided through the i-th scan line SLi during the data writing and compensation period, the second transistor T2 and the third transistor T3 are turned on. At this time, the first transistor T1 is diode-connected by the turned-on third transistor T3 and is biased in a forward direction. Then, a compensation voltage Di-Vth, which is obtained by subtracting a threshold voltage Vth of the first transistor T1 from the data signal DSj provided from the data line DLj, is applied to the gate electrode of the first transistor T1. In other words, a gate voltage applied to the gate electrode of the first transistor T1 may be the compensation voltage Di-Vth.

The second driving voltage ELVDD and the compensation voltage Di-Vth may be respectively applied to both ends of the capacitor Cst, and a charge corresponding to the voltage difference between the both ends may be stored in the capacitor Cst.

Next, the light emission control signal EMi provided from the light emission control line ELi changes from a high level to a low level when the light emission period LEP starts and is maintained at the low level during the light emission period LEP. The fifth transistor T5 and the sixth transistor T6 are turned on by the light emission control signal EMi having the low level during the light emission period LEP. Then, a driving current is generated depending on the voltage difference between the gate voltage of the gate electrode of the first transistor T1 and the second driving voltage ELVDD, the driving current is supplied to the organic light emitting diode LD through the sixth transistor T6 and thus the driving current flows through the organic light emitting diode LD. A gate-source voltage Vgs of the first transistor T1 may be maintained at '(Di-Vth)-ELVDD' by the capacitor Cst during the light emission period LEP, and the driving current may be, according to the current-voltage relationship of the first transistor T1, proportional to the square of a value obtained by subtracting the threshold voltage from the gate-source voltage, in other words, '(Di-ELVDD)$^2$'. Accordingly, a driving current Id may be determined regardless of the threshold voltage Vth of the first transistor T1.

The one frame FR may include a sensing period SP, an initialization period IP, and a light exposure period EP according to the operation of the light sensing pixel FXij. The sensing period SP, initialization period IP and the light exposure period EP may be in sequence.

The light exposure period EP of the light sensing pixel FXij may correspond to the light emission period LEP of the light emitting pixel PXij. In other words, the light exposure period EP of the light sensing pixel FXij may overlap the light emission period LEP of the light emitting pixel PXij. The organic photodiode OPD is exposed to external light during the light exposure period EP. The organic photodiode OPD may use a charge as a main charge carrier.

When there is a user input TC (see FIG. 1), the organic photodiode OPD may generate photocharges corresponding to light reflected by a ridge of the fingerprint or a valley between ridges, and the generated photocharges may accumulate in the charge storage node FN.

The amplifying transistor FT2 may be a source follower amplifier that generates a source-drain current in proportion to the amount of charge of the charge storage node FN inputted to the gate electrode of the amplifying transistor FT2.

During the sensing period SP, a second scan signal SCi-1 having the low level is provided through the (i−1)-th scan line SLi-1. The first scan signal SCi may have the high level during the sensing period SP. When the output transistor FT3 is turned on in response to the second scan signal SCi-1 having the low level, a fingerprint sensing signal FSj corresponding to a current flowing through the amplifying transistor FT2 may be outputted to the fingerprint sensing line FSLj. The sensing period SP of the light sensing pixel FXij may correspond to the initialization period of the light emitting pixel PXij. In other words, the sensing period SP of the light sensing pixel FXij may overlap the initialization period of the light emitting pixel PXij.

Next, when a first scan signal SCi having the low level is provided through the scan line SLi during the initialization period IP, the reset transistor FT1 is turned on. In this case, because a second scan signal SCi-1 having a high level is provided to the source electrode of the reset transistor FT1, the second scan signal SCi-1 having the high level may be transmitted to the charge storage node FN to reset the charge storage node FN.

During the following light exposure period EP, the organic photodiode OPD may generate photocharges corresponding to received external light, and the generated photocharges may accumulate in the charge storage node FN.

As such, both the light emitting pixel PXij and the light sensing pixel FXij may be provided in the display panel DP, and the light sensing pixel FXij may be driven using the first scan signal SCi and the second scan signal SCi-1 that are used to drive the light emitting pixel PXij. Both the light emitting pixel PXij and the light sensing pixel FXij may be driven while the first scan signal SCi and the second scan signal SCi-1 have the high level. Accordingly, an increase in the size of the display device DD (see FIG. 1) may be minimized, and manufacturing costs may be reduced because a separate circuit for driving the light sensing pixel FXij is unnecessary.

Figure 10:
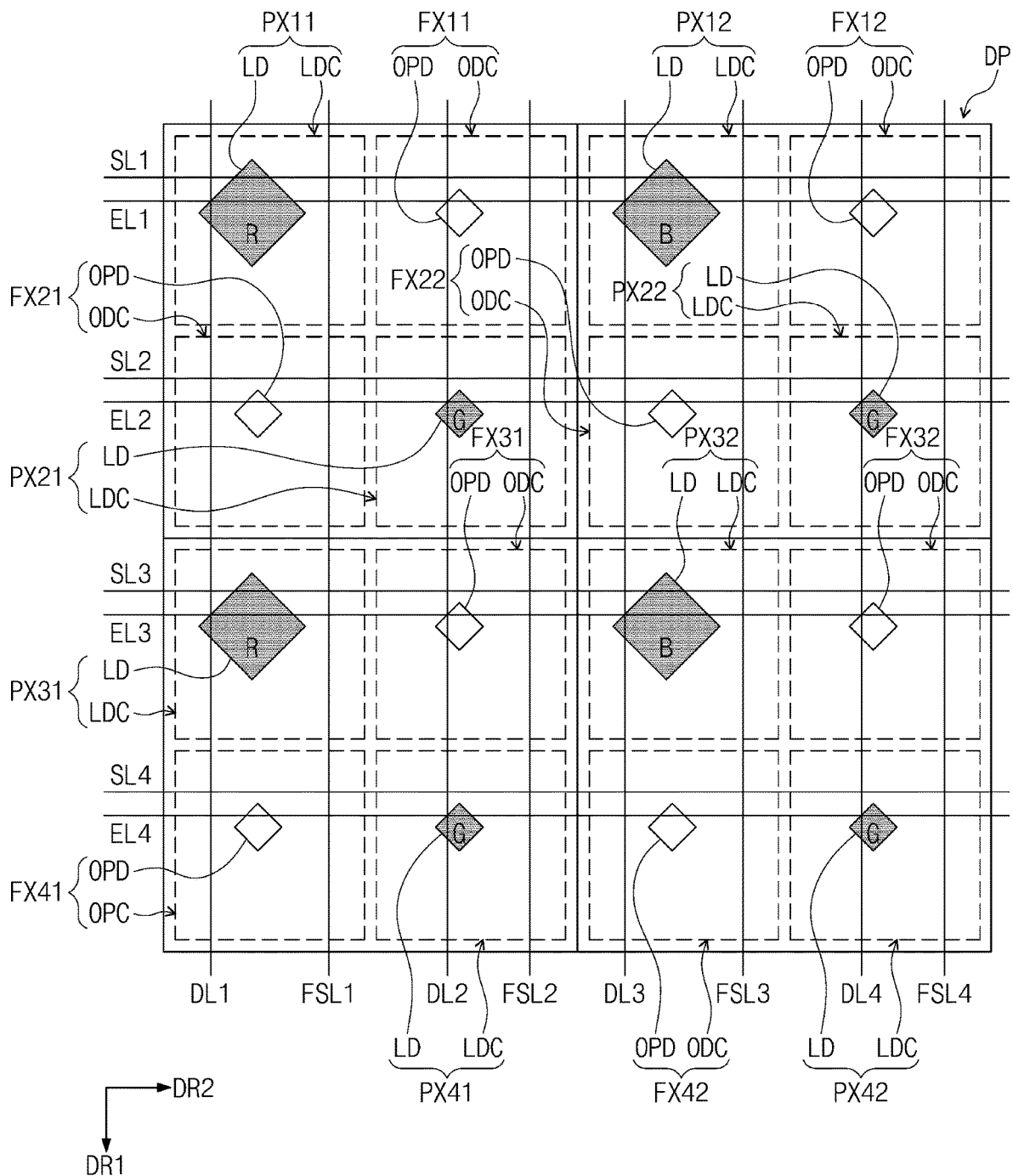
FIG. 10 is an enlarged plan view of a portion of a display panel of an exemplary embodiment of the present invention.

FIG. 10 is an enlarged plan view of a portion of the display panel DP of an exemplary embodiment of the present invention.

Referring to FIGS. 7 and 10, the display panel DP includes light emitting pixels PX11, PX12, PX21, PX22, PX31, PX32, PX41 and PX42 and light sensing pixels FX11, FX12, FX21, FX22, FX31, FX32, FX41 and FX42. Each of the light emitting pixels PX11 to PX42 includes the light emitting diode LD and the light emission driving circuit LDC. Each of the light sensing pixels FX11 to FX42 includes the organic photodiode OPD and the light sensing driving circuit ODC.

The light emitting pixels PX11 to PX42 and the light sensing pixels FX11 to FX42 are alternately and sequentially arranged in the first direction DR1, and in the second direction DR2. For example, the light emitting pixel PX11, the light sensing pixel FX21, the light emitting pixel PX31, and the light sensing pixel FX41 are sequentially arranged in the first direction DR1 in a first column. In addition, the light emitting pixel PX11, the light sensing pixel FX11, the light emitting pixel PX12, and the light sensing pixel FX12 are sequentially arranged in the second direction DR2 in a first row. According to this arrangement, each of the light sensing pixels FX11 to FX42 may be disposed adjacent to a corresponding one of the light emitting pixels PX11 to PX42.

Light emitting pixels of the same color are arranged in the same column in the first direction DR1. For example, light emitting pixels PX11 and PX31 including a light emitting diode LD of a first color (e.g., red R) may be sequentially disposed in the first column, light emitting pixels PX21 and PX41 including a light emitting diode LD of a second color (e.g., green G) may be sequentially disposed in a second column, and light emitting pixels PX12 and PX32 including a light emitting diode LD of a third color (e.g., blue B) may be sequentially disposed in a third column. Although the light emitting pixels PX11 and PX31 are sequentially disposed on the first column, the light sensing pixel FX21 is provided between the light emitting pixels PX11 and PX31. Similarly, the light sensing pixel FX31 is disposed between the light emitting pixels PX21 and PX41 in the second column.

In an odd-numbered row in the second direction DR2, a light emitting pixel including the light emitting diode LD of the first color (e.g., red R) and a light emitting pixel including the light emitting diode LD of the third color (e.g., blue B) may be sequentially arranged. For example, in the first row, the light emitting pixel PX11 including the light emitting diode LD of the first color (e.g., red R) and the light emitting pixel PX12 including the light emitting diode LD of the third color (e.g., blue B) are sequentially disposed. In an even-numbered row in the second direction DR2, light emitting pixels including the light emitting diode LD of the second color (e.g., green G) may be sequentially arranged. For example, in the second row, the light emitting pixels PX21 and PX22 including the light emitting diode LD of the second color (e.g., green G) are sequentially disposed.

In an exemplary embodiment of the present invention, each of the light emitting diode LD of the first color (e.g., red R) and the light emitting diode LD of the third color (e.g., blue B) may have a larger size than the light emitting diode LD of the second color (e.g., green G). In addition, the light emitting diode LD of the third color (e.g., blue B) may have a larger size than the light emitting diode LD of the first color (e.g., red R). The sizes of the light emitting diodes LD of the first to third colors (e.g., red R, green G, and blue B) are not limited thereto and may be modified and applied in various ways.

In addition, the organic photodiode OPD may have a smaller size than the light emitting diode LD of the first color (e.g., red R) and the light emitting diode LD of the third color (e.g., blue B). The organic photodiode OPD may have a size similar to that of the light emitting diode LD of the second color (e.g., green G). The size of the organic photodiode OPD is not limited thereto and may be modified and applied in various ways.

Figure 11:
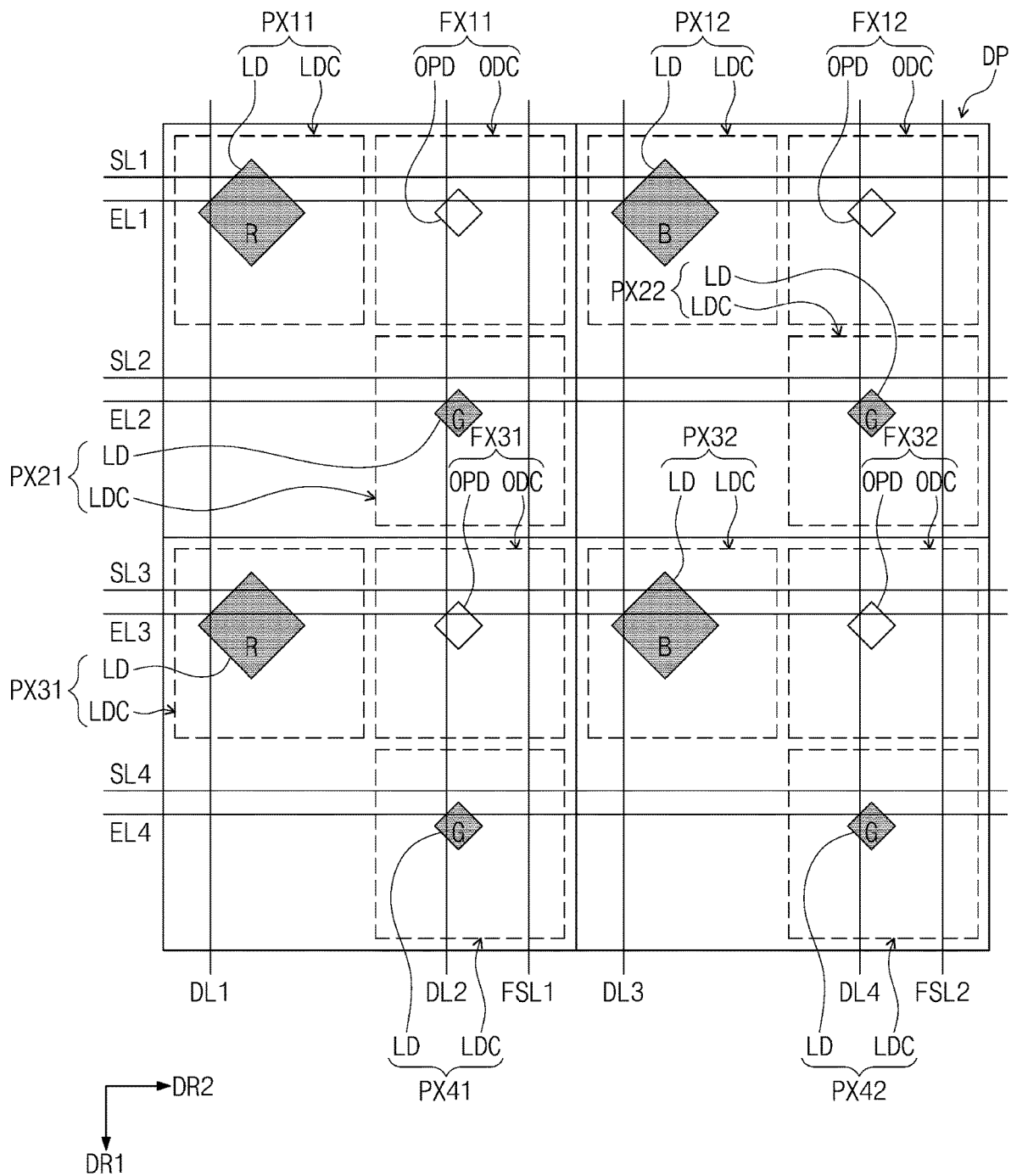
FIG. 11 is an enlarged plan view of a portion of a display panel of an exemplary embodiment of the present invention.

FIG. 11 is an enlarged plan view of a portion of a display panel DP of an exemplary embodiment of the present invention.

The display panel DP illustrated in FIG. 11 may include only some of the light sensing pixels FX11 to FX42 illustrated in FIG. 10. In other words, only the light emitting pixels PX11 and PX31 including the light emitting diode LD of the first color (e.g., red R) are disposed in the first column in the first direction DR1. No light sensing pixel is disposed in the first column in the first direction DR1 between the light emitting pixels PX11 and PX31. In addition, in the third column in the first direction DR1, only the light emitting pixels PX12 and PX32 including the light emitting diode LD of the third color (e.g., blue B) are disposed. No light sensing pixel is disposed in the third column in the first direction DR1 between the light emitting pixels PX12 and PX32.

Figure 12:
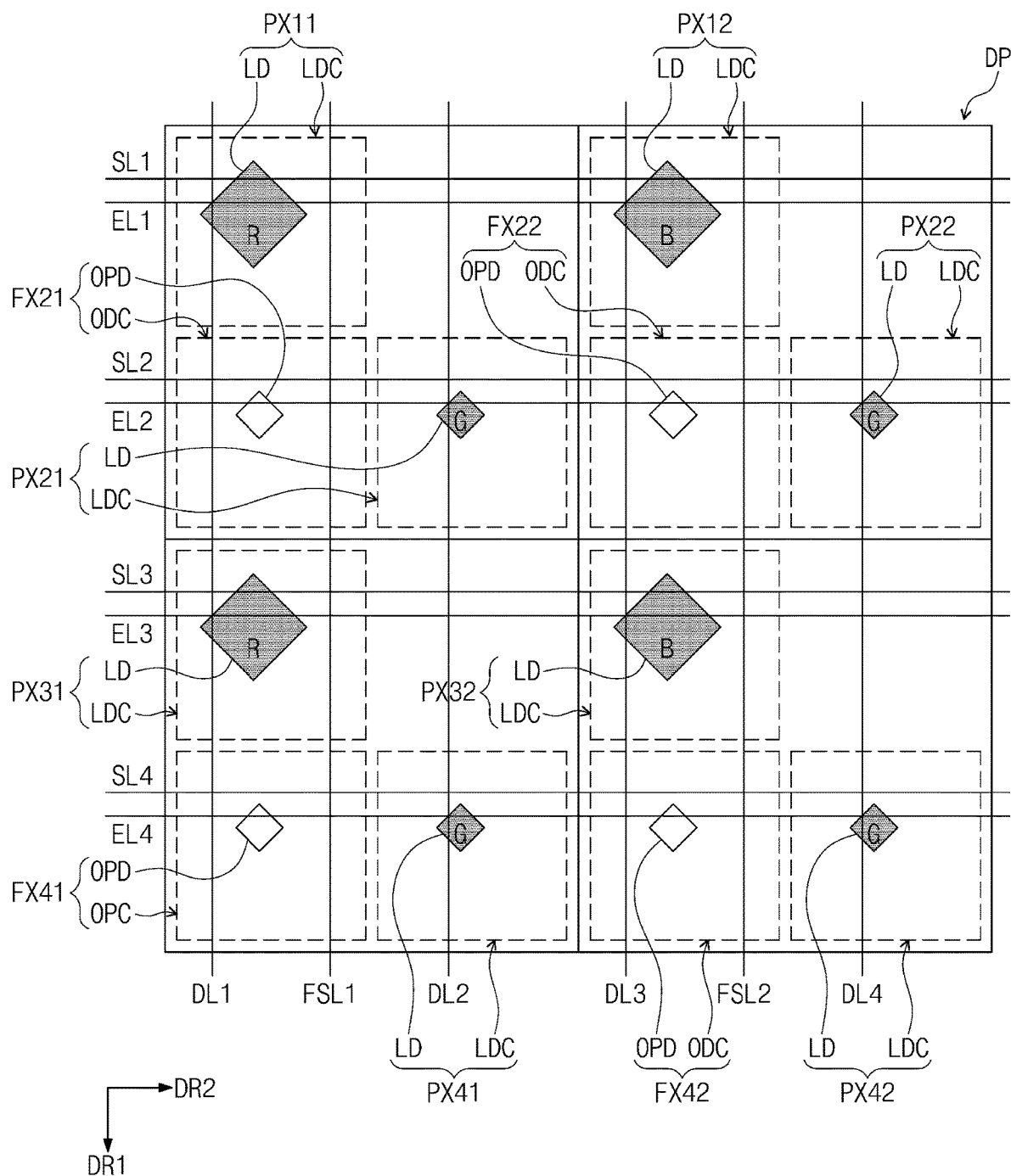
FIG. 12 is an enlarged plan view of a portion of a display panel of an exemplary embodiment of the present invention.

FIG. 12 is an enlarged plan view of a portion of a display panel DP of an exemplary embodiment of the present invention.

The display panel DP illustrated in FIG. 12 may include only some of the light sensing pixels FX11 to FX42 illustrated in FIG. 10. In other words, only the light emitting pixel PX11 including the light emitting diode LD of the first color (e.g., red R) and the light emitting pixel PX12 including the light emitting diode LD of the third color (e.g., blue B) are disposed in the first row in the second direction DR2. No light sensing pixel is disposed in the first row in the second direction DR2 between the light emitting pixels PX11 and PX12. In addition, only the light emitting pixel PX31 including the light emitting diode LD of the first color (e.g., red R) and the light emitting pixel PX32 including the light emitting diode LD of the third color (e.g., blue B) are disposed in a third row in the second direction DR2. No light sensing pixel is disposed in the third row in the second direction DR2 between the light emitting pixels PX31 and PX32.

Exemplary embodiments of the present invention are not limited to the examples illustrated in FIGS. 10, 11, and 12, and the light emitting pixels and the light sensing pixels may be modified and disposed in various ways.

Figure 13:
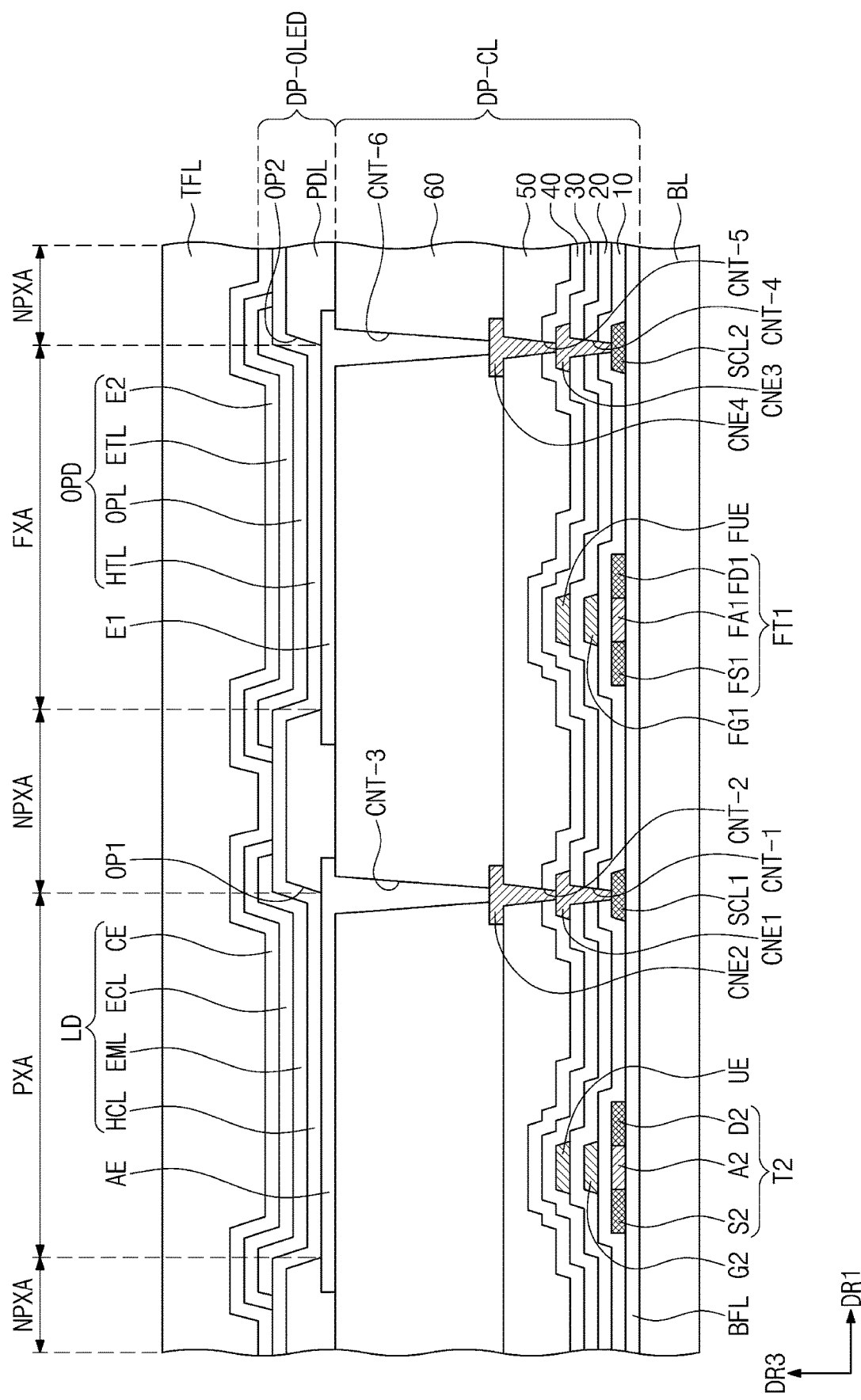
FIG. 13 is an enlarged cross-sectional view of a display panel according to an exemplary embodiment of the present invention.

FIG. 13 is an enlarged cross-sectional view of the display panel DP according to an exemplary embodiment of the present invention.

Referring to FIG. 13, the display panel DP may include a plurality of insulating layers, a semiconductor pattern, a conductive pattern, a signal line, and the like. Each of the insulating layers, a semiconductor layer, and a conductive layer are formed by coating, vapor deposition, or the like. Thereafter, the insulating layer, the semiconductor layer, and the conductive layer may be selectively patterned by photolithography. In this method, the semiconductor pattern, the conductive pattern, the signal line, and the like are formed which are included in the circuit element layer DP-CL and the display element layer DP-OLED.

The base layer BL may include a synthetic resin film. The synthetic resin film may include a thermosetting resin. The base layer BL may have a multilayer structure. For example, the base layer BL may have a three-layer structure of a synthetic resin film, an adhesive layer, and a synthetic resin film. In particular, the synthetic resin film may be a polyimide resin layer, and the material thereof is not particularly limited. The synthetic resin film may include acrylic resin, methacrylic resin, polyisoprene, vinyl resin, epoxy resin, urethane resin, cellulose resin, siloxane resin, polyamide resin, or perylene resin. In addition, the base layer BL may include a glass substrate, a metal substrate, an organic/inorganic composite substrate, or the like.

Light emission electronic devices and light sensing electronic elements are disposed on the base layer BL. The light emission electronic devices include transistors T1 to T7 and a capacitor Cst in the light emitting driving circuit LDC illustrated in FIG. 8. The light sensing devices include transistors FT1 to FT3 in the light sensing driving circuit ODC illustrated in FIG. 8.

At least one inorganic layer is formed on a top surface of the base layer BL. The inorganic layer may include aluminum oxide, titanium oxide, silicon oxide, silicon oxynitride, zirconium oxide, or hafnium oxide. The inorganic layer may be formed in multiple layers. The multilayer inorganic layer may constitute a barrier layer and/or a buffer layer. In this exemplary embodiment, the display panel DP is illustrated as including a buffer layer BFL.

The buffer layer BFL improves the bonding force between the base layer BL and the semiconductor pattern. The buffer layer BFL may include a silicon oxide layer and a silicon nitride layer. The silicon oxide layer and the silicon nitride layer may be alternately laminated.

The semiconductor pattern is disposed on the buffer layer BFL. The semiconductor pattern may include polysilicon. However, the semiconductor pattern is not limited thereto and may include amorphous silicon or a metal oxide.

FIG. 13 illustrates the semiconductor pattern partially, and when viewed in a plane, another part of the semiconductor pattern may further be disposed in another region of the pixel PX. The semiconductor pattern may be arranged with a specific rule across the light emitting pixels PX and the light sensing pixels FX. The semiconductor pattern has different electrical properties depending on whether portions of it are doped. The semiconductor pattern may include a doped region and a non-doped region. The doped region may be doped with an N-type dopant or a P-type dopant. A P-type transistor includes a doped region doped with a P-type dopant.

The doped region has higher conductivity than the non-doped region, and may serve as an electrode or a signal line. The non-doped region corresponds to an active region (or channel) of a transistor. Hereinafter, the active region may be referred to as an 'active.' In other words, a first portion of the semiconductor pattern may be the active of the transistor, a second portion of the semiconductor pattern may be a source or drain of the transistor, and a third portion of the semiconductor pattern may be a connection electrode or a connection signal line.

As illustrated in FIG. 13, a source S2, an active A2, and a drain D2 of the second transistor T2 are formed from the semiconductor pattern, and a source FS1, an active FA1, and a drain FD1 of the reset transistor FT1 are formed from the semiconductor pattern. When viewed on the cross section, the source S2 and the drain D2 extend in opposite directions from the active A2, and the source FS1 and the drain FD1 extend in opposite directions from the active FA1. FIG. 13 illustrates portions of connection signal lines SCL1 and SCL2 formed from the semiconductor pattern. When viewed in a plane, the connection signal line SCL1 may be connected to the drain D2 of the second transistor T2, and the connection signal line SCL2 may be connected to the drain FD1 of the reset transistor FT1. In FIG. 13, the reset transistor FT1 is disposed between the connection signal lines SCL1 and SCL2.

A first insulating layer 10 is disposed on the buffer layer BFL. The first insulating layer 10 overlaps the plurality of light emitting pixels PX (see FIG. 7) and the plurality of light sensing pixels FX (see FIG. 7) and covers the semiconductor pattern. The first insulating layer 10 may be an inorganic layer and/or an organic layer, and may have a single layer structure or a multilayer structure. The first insulating layer 10 may include aluminum oxide, titanium oxide, silicon oxide, silicon oxynitride, zirconium oxide, or hafnium oxide. In this embodiment, the first insulating layer 10 may be a single layer of silicon oxide. In addition to the first insulating layer 10, an insulating layer of the circuit element layer DP-CL to be described later may be an inorganic layer and/or an organic layer, and may have a single layer structure or a multilayer structure. The inorganic layer may include at least one of the above-described materials.

Gates G2 and FG1 are disposed on the first insulating layer 10. The gates G2 and FG1 may be a portion of a metal pattern. The gates G2 and FG1 respectively overlap the actives A2 and FA1 with the first insulating layer 10 therebetween. In a process of doping the semiconductor pattern, the gates G2 and FG1 serve as masks.

A second insulating layer 20 covering the gates G2 and FG1 is disposed on the first insulating layer 10. The second insulating layer 20 overlaps the light emitting pixels PX (see FIG. 7) and the light sensing pixels FX (see FIG. 7). The second insulating layer 20 may be an inorganic layer and/or an organic layer, and may have a single layer structure or a multilayer structure. In this embodiment, the second insulating layer 20 may be a single layer of silicon oxide.

Upper electrodes UE and FUE may be disposed on the second insulating layer 20. The upper electrode UE may overlap the gate G2 and the active A2 of the second transistor T2, and the upper electrode FUE may overlap the gate FG1 and the active FA1 of the reset transistor FT1. The upper electrodes UE and FUE may be a portion of a metal pattern. A portion of the gate G2 and the upper electrode UE overlapping the portion of the gate G2 may form the capacitor Cst (see FIG. 8). In an exemplary embodiment of the present invention, the upper electrode UE may be omitted.

A third insulating layer 30 covering the upper electrodes UE and FUE is disposed on the second insulating layer 20. In this embodiment, the third insulating layer 30 may be a single layer of silicon oxide. A first connection electrode CNE1 and a third connection electrode CNE3 may be disposed on the third insulating layer 30. The first connection electrode CNE1 may be connected to the connection signal line SCL1 through a contact hole CNT-1 penetrating the first to third insulating layers 10 to 30. The third connection electrode CNE3 may be connected to the connection signal line SCL2 through a contact hole CNT-4 penetrating the first to third insulating layers 10 to 30.

A fourth insulating layer 40 covering the first connection electrode CNE1 and the third connection electrode CNE3 may be disposed on the third insulating layer 30. The fourth insulating layer 40 may be a single layer of silicon oxide. A fifth insulating layer 50 is disposed on the fourth insulating layer 40. The fifth insulating layer 50 may be an organic layer. A second connection electrode CNE2 and a fourth connection electrode CNE4 may be disposed on the fifth insulating layer 50. The second connection electrode CNE2 may be connected to the first connection electrode CNE1 through a contact hole CNT-2 penetrating the fourth insulating layer 40 and the fifth insulating layer 50. For example, the second connection electrode CNE2 may directly contact the first connection electrode CNE1 via the contact hole CNT-2. The fourth connection electrode CNE4 may be connected to the third connection electrode CNE3 through a contact hole CNT-5 penetrating the fourth insulating layer 40 and the fifth insulating layer 50. For example, the fourth connection electrode CNE4 may directly contact the third connection electrode CNE3 via the contact hole CNT-5.

A sixth insulating layer 60 covering the second connection electrode CNE2 and the fourth connection electrode CNE4 is disposed on the fifth insulating layer 50. The sixth insulating layer 60 may be an organic layer. An anode AE is disposed on the sixth insulating layer 60. The anode AE is connected to the second connection electrode CNE2 through a contact hole CNT-3 penetrating the sixth insulating layer 60. An opening OP1 is provided in a pixel defining film PDL. The opening OP1 of the pixel defining film PDL exposes at least a portion of the anode AE.

As illustrated in FIG. 13, the display area DP-DA may include a light emitting area PXA, a non-light emitting area NPXA, and a light sensing area FXA. The non-light emitting area NPXA may surround the light emitting area PXA and the light sensing area FXA. In this embodiment, the light emitting area PXA corresponds to the portion of the anode AE exposed by the opening OP1. In other words, the area above the portion of the anode AE exposed by the opening OP1 forms the light emitting area PXA.

A hole control layer HCL may be disposed in the light emitting area PXA and the non-light emitting area NPXA. The hole control layer HCL includes a hole transport layer, and may further include a hole injection layer. A light emitting layer EML is disposed on the hole control layer HCL. The light emitting layer EML may be disposed in an area corresponding to the opening OP1. Accordingly, the light emitting layer EML may be separately formed in each of the light emitting pixels PX.

An electron control layer ECL is disposed on the light emitting layer EML. The electron control layer ECL includes an electron transport layer, and may further include an electron injection layer. The hole control layer HCL and the electron control layer ECL may be formed in common, using an open mask, in the plurality of light emitting pixels PX. A cathode CE is disposed on the electron control layer ECL. The cathode CE has an integral shape and is disposed in common in the plurality of light emitting pixels PX (see FIG. 7).

As illustrated in FIG. 13, the upper insulating layer TFL is disposed on the cathode CE. The upper insulating layer TFL may include a plurality of thin films. A capping layer and a thin film encapsulation layer may be included in the upper insulating layer TFL. The thin film encapsulation layer may include a first inorganic layer, an organic layer, and a second inorganic layer.

The capping layer may include an organic material. The capping layer protects the cathode CE from a subsequent process such as a sputtering process, and enhances light emission efficiency of the organic light emitting diode LD. The capping layer may have a larger refractive index than the first inorganic layer.

The first inorganic layer and the second inorganic layer protect the display element layer DP-OLED from moisture/oxygen, and the organic layer protects the display element layer DP-OLED from foreign matter such as dust particles. The first inorganic layer and the second inorganic layer may be any one of a silicon nitride layer, a silicon oxynitride layer, and a silicon oxide layer. In an exemplary embodiment of the present invention, the first inorganic layer and the second inorganic layer may include a titanium oxide layer, an aluminum oxide layer, or the like. The organic layer may include an acrylic organic layer and is not limited thereto.

In addition, a first electrode E1 of the organic photodiode OPD is disposed on the sixth insulating layer 60. The first electrode E1 is connected to the fourth connection electrode CNE4 through a contact hole CNT-6 penetrating the sixth insulating layer 60. An opening OP2 is provided in the pixel defining film PDL. The opening OP2 of the pixel defining film PDL exposes at least a portion of the first electrode E1.

A hole transport layer HTL may be formed of the same material and in the same process as the hole control layer HCL of the organic light emitting diode LD. A photoelectric conversion layer OPL is disposed on the hole transport layer HTL. The photoelectric conversion layer OPL may be disposed in an area corresponding to the opening OP2. Accordingly, the photoelectric conversion layer OPL may be separately formed in each of the light sensing pixels FX.

An electron transport layer ETL is disposed on the photoelectric conversion layer OPL. The hole transport layer HTL and the electron transport layer ETL may be formed in common, using an open mask, in the plurality of light sensing pixels FX. In addition, the hole control layer HCL of the light emitting pixels PX may be formed of the same material in the same process as the hole transport layer HTL of the light sensing pixels FX. In addition, the electron control layer ECL of the light emitting pixels PX may be formed of the same material in the same process as the electron transport layer ETL of the light sensing pixels FX.

A second electrode E2 is disposed on the electron transport layer ETL. The second electrode E2 has an integral shape and is disposed in the plurality of light sensing pixels FX (see FIG. 7) in common. In addition, the second electrode E2 has an integral shape and may be disposed in common with the cathode CE of the plurality of light emitting pixels PX (see FIG. 7).

In other words, the cathode CE of the organic light emitting diode LD in the plurality of light emitting pixels PX and the second electrode E2 of the organic photodiode OPD in the plurality of light sensing pixels FX may be formed of the same material in the same process. In addition, as illustrated in FIG. 8, the cathode CE of the organic light emitting diode LD and the second electrode E2 of the organic photodiode OPD may be electrically connected to the third voltage line VL3 transmitting the first driving voltage ELVSS.

The display panel having such a configuration includes, on the same substrate, the light emitting pixels having the light emitting element and the light sensing pixels sensing external light. Accordingly, the display panel may not only display image information but also sense a user's biometric fingerprint information.

By implementing the light emitting pixels and the light sensing pixels in a single panel, the volume of the display device may be minimized and manufacturing costs thereof may be reduced.

Exemplary embodiments of the present invention provide a display device including a display panel capable of sensing a biometric fingerprint input.

While the present invention has been described with reference to exemplary embodiments thereof, it is understood that various changes and modifications can be made thereto by one of ordinary skill in the art without departing from the spirit and scope of the present invention as set forth in the attached claims.

What is claimed is:

1. A display panel, comprising:
   a plurality of light emitting pixels which emit light in response to a first scan signal, a second scan signal, and a light emission control signal; and
   a plurality of light sensing pixels which output a sensing signal corresponding to external light in response to the first scan signal and the second scan signal,
   wherein each of the plurality of light emitting pixels comprises an organic light emitting diode including an anode and a cathode, the cathode receiving a first driving voltage, and
   each of the plurality of light sensing pixels comprises an organic photodiode including a first electrode and a second electrode,
   wherein the second electrode of the organic photodiode is electrically connected to the cathode of the organic light emitting diode to receive the first driving voltage.

2. The display panel of claim 1, wherein each of the plurality of light sensing pixels further comprises:
   a first transistor including a first electrode configured to receive the second scan signal, a second electrode connected to a charge storage node, and a gate electrode configured to receive the first scan signal;
   a second transistor including a first electrode, which receives a second driving voltage, a second electrode, and a gate electrode connected to the charge storage node; and
   a third transistor including a first electrode connected to the second electrode of the second transistor, a second electrode connected to a fingerprint sensing line, and a gate electrode configured to receive the second scan signal.

3. The display panel of claim 2, wherein the first electrode of the organic photodiode is electrically connected to the charge storage node.

4. The display panel of claim 3, wherein the second scan signal has a voltage level higher than the first driving voltage when the first scan signal turns on the first transistor.

5. The display panel of claim 2, wherein
   each of the plurality of light emitting pixels emits light when the light emission control signal is at an active level, and
   each of the plurality of the light sensing pixels stores a charge corresponding to the external light in the charge storage node, outputs a fingerprint sensing signal corresponding to the charge stored in the charge storage node to the fingerprint sensing line when the second scan signal is at the active level, and resets the charge storage node when the first scan signal is at the active level.

6. The display panel of claim 1, wherein each of the plurality of light emitting pixels further comprises:
   a first transistor including a first electrode, which receives a data signal, a second electrode, and a gate electrode configured to receive the first scan signal;
   a second transistor which includes a gate electrode configured to receive the light emission control signal; and
   a third transistor connected to the first transistor and the second transistor and configured to provide a driving current to the organic light emitting diode.

7. The display panel of claim 6, wherein each of the plurality of light emitting pixels further comprises a fourth transistor which includes a gate electrode configured to receive the second scan signal and transmits an initialization voltage to a gate electrode of the third transistor.

8. The display panel of claim 6, wherein each of the plurality of light emitting pixels further comprises a fifth transistor which is connected between the first transistor and the anode of the organic light emitting diode and includes a gate electrode configured to receive the light emission control signal.

9. The display panel of claim 1, wherein
   the plurality of light emitting pixels comprises a first color light emitting pixel, a second color light emitting pixel, and a third color light emitting pixel.

10. The display panel of claim 9, wherein
   the first color light emitting pixel, at least one of the plurality of light sensing pixels, the second color light emitting pixel, and at least one of the plurality of light sensing pixels are sequentially arranged in a second direction crossing a first direction in a first row, and
   at least one of the plurality of light sensing pixels and the third color light emitting pixel are sequentially arranged in the second direction in a second row adjacent to the first row.

11. A display device, comprising:
   a display panel comprising a plurality of light emitting pixels and a plurality of light sensing pixels; and
   a fingerprint readout circuit which controls the display panel and receives a fingerprint sensing signal through a fingerprint sensing line from the light sensing pixels,
   wherein each of the plurality of light emitting pixels comprises an organic light emitting diode including an anode and a cathode, the cathode connected to a first driving voltage line, and
   each of the plurality of light sensing pixels comprises an organic photodiode which comprises a first electrode and a second electrode,
   wherein the second electrode of the organic photodiode is connected to the first driving voltage line.

12. The display device of claim 11, wherein each of the plurality of light sensing pixels further comprises:
   a reset transistor comprising a gate electrode configured to receive a first scan signal, a first electrode configured to receive a second scan signal, and a second electrode connected to a charge storage node;
   an amplifying transistor comprising a gate electrode connected to the charge storage node, a first electrode configured to receive a second driving voltage, and a second electrode; and an output transistor comprising a gate electrode configured to receive the second scan signal, a first electrode connected to the second electrode of the amplifying transistor, and a second electrode connected to the fingerprint sensing line.

13. The display device of claim 12, wherein the first electrode of the organic photodiode is electrically connected to the charge storage node.

14. The display device of claim 13, wherein the second scan signal has a voltage level higher than a first driving voltage when the first scan signal is at an active level.

15. The display device of claim 12, wherein
each of the plurality of light emitting pixels emits light in response to the first scan signal, the second scan signal, and a light emission control signal, and
each of the plurality of the light sensing pixels stores a charge corresponding to external light in the charge storage node, outputs a fingerprint sensing signal corresponding to the charge stored in the charge storage node to the fingerprint sensing line when the second scan signal is at an active level, and resets the charge storage node when the first scan signal is at the active level.

16. The display device of claim 15, wherein the display panel further comprises a scan driver configured to output the first scan signal, the second scan signal, and the light emission control signal.

17. A display device, comprising:
a base layer;
light emission electronic devices disposed on the base layer;
light sensing electronic devices disposed on the base layer;
an organic light emitting diode comprising an anode electrically connected to the light emission electronic devices, a cathode, and a light emitting layer disposed between the anode and the cathode; and
an organic photodiode comprising a first electrode electrically connected to the light sensing electronic devices, a second electrode, and a photoelectric conversion layer disposed between the first electrode and the second electrode,
wherein the second electrode of the organic photodiode and the cathode of the organic light emitting diode are included in the same layer.

18. The display device of claim 17, wherein
the base layer comprises a display area and a non-display area adjacent to the display area, and
the organic light emitting diode and the organic photodiode are disposed above the base layer in the display area.

19. The display device of claim 17, wherein
at least one of the light emission electronic devices is configured to control the organic light emitting diode to emit light in response to a first scan signal, a second scan signal, and a light emission control signal, and
at least one of the light sensing electronic devices stores a charge generated by the organic photodiode in a charge storage node, outputs a fingerprint sensing signal, to a fingerprint sensing line, when the second scan signal is at an active level, and resets the charge storage node when the first scan signal is at an active level,
wherein the fingerprint sensing signal corresponds to the charge stored in the charge storage node.

20. The display device of claim 19, wherein the at least one light sensing electronic device comprises:
a reset transistor comprising a gate electrode configured to receive the first scan signal, a first electrode configured to receive the second scan signal, and a second electrode connected to the charge storage node;
an amplifying transistor comprising a gate electrode connected to the charge storage node, a first electrode configured to receive a second driving voltage, and a second electrode; and
an output transistor comprising a gate electrode configured to receive the second scan signal, a first electrode connected to the second electrode of the amplifying transistor, and a second electrode connected to the fingerprint sensing line,
wherein the first electrode of the organic photodiode is connected to the charge storage node.

* * * * *